(12) United States Patent
Smith et al.

(10) Patent No.: US 7,337,552 B2
(45) Date of Patent: Mar. 4, 2008

(54) METHOD AND APPARATUS FOR REGISTRATION WITH INTEGRAL ALIGNMENT OPTICS

(75) Inventors: Adlai H. Smith, Escondido, CA (US); Robert O. Hunter, Jr., San Diego, CA (US); Bruce B. McArthur, San Diego, CA (US); Thomas K. Khuu, San Diego, CA (US); Yuji Yamaguchi, San Diego, CA (US)

(73) Assignee: Litel Instruments, San Diego, CA (US)

( * ) Notice: Subject to any disclaimer, the term of this patent is extended or adjusted under 35 U.S.C. 154(b) by 0 days.

(21) Appl. No.: 10/925,745

(22) Filed: Aug. 24, 2004

(65) Prior Publication Data

US 2006/0042106 A1  Mar. 2, 2006

(51) Int. Cl.
*G01D 21/00* (2006.01)
*G03B 27/42* (2006.01)

(52) U.S. Cl. .............................. 33/645; 33/297; 355/53
(58) Field of Classification Search .................. 33/645, 33/286, 533, 297; 355/52, 53, 55
See application file for complete search history.

(56) References Cited

U.S. PATENT DOCUMENTS

| | | | | |
|---|---|---|---|---|
| 4,437,758 A * | 3/1984 | Suzuki | ........................ | 355/41 |
| 4,540,277 A * | 9/1985 | Mayer et al. | .................. | 355/53 |
| 5,182,455 A * | 1/1993 | Muraki | ........................ | 250/548 |
| 5,272,501 A * | 12/1993 | Nishi et al. | .................... | 355/53 |
| 5,392,119 A * | 2/1995 | McArthur et al. | ........... | 356/515 |
| 5,504,999 A * | 4/1996 | Barr | ............................. | 33/286 |
| 5,625,471 A * | 4/1997 | Smith | .......................... | 359/30 |
| 5,699,185 A * | 12/1997 | MacDonald et al. | ........ | 359/569 |
| 5,777,722 A * | 7/1998 | Miyazaki et al. | ............. | 355/53 |
| 5,828,455 A | 10/1998 | Smith et al. | | |
| 5,894,350 A * | 4/1999 | Hsieh et al. | ................. | 356/399 |
| 5,940,194 A * | 8/1999 | Christie et al. | ............... | 359/15 |
| 5,978,085 A * | 11/1999 | Smith et al. | ................. | 356/521 |
| 6,285,033 B1 * | 9/2001 | Matsumoto | .................. | 250/548 |
| 6,356,345 B1 | 3/2002 | McArthur et al. | | |
| 6,483,572 B2 * | 11/2002 | Simpson et al. | ............. | 355/53 |
| 6,559,924 B2 * | 5/2003 | Ina et al. | ........................ | 355/53 |
| 6,745,484 B2 * | 6/2004 | Horie et al. | .................. | 33/297 |
| 6,879,868 B2 * | 4/2005 | Mos et al. | ................... | 700/114 |
| 6,909,984 B2 * | 6/2005 | Laursen et al. | ............. | 702/109 |
| 7,089,677 B2 * | 8/2006 | Lu et al. | ........................ | 33/645 |
| 7,126,757 B2 * | 10/2006 | Mori | .......................... | 359/619 |
| 7,268,360 B2 * | 9/2007 | Smith et al. | ............. | 250/559.1 |
| 7,271,905 B2 * | 9/2007 | Smith et al. | ................. | 356/401 |

OTHER PUBLICATIONS

T. Kanda et al., "0.85NA ArF Exposure System and Performance", Proc. of SPIE, vol. 5040, 2003, pp. 789-800.
S. Walker et al., "Array generation with multilevel phase gratings", J. Opt. Soc. Am., vol. 7, No. 8, Aug. 1990, pp. 1509-1513.

(Continued)

*Primary Examiner*—G. Bradley Bennett
*Assistant Examiner*—Amy R. Cohen

(57) ABSTRACT

A method and apparatus for front to back substrate registration is described. Alignment characteristics of features on surfaces of substrates can be used to physically align substrates with a multiplicity of integrated alignment optics. Measurement of offsets of the integral alignment optics are used to compute registration data for use in calibration of the substrate global alignment.

22 Claims, 24 Drawing Sheets

OTHER PUBLICATIONS

J. McLeod, "The Axicon: A New Type of Optical Element", J. Opt. Soc. Am., vol. 40, Aug. 1954, pp. 592-597.

A. Lohmann et al., "Binary Fraunhofer Holograms, Generated by Computer", Applied Optics, vol. 6, No. 10, Oct. 1967, pp. 1739-1748.

A. Vasara et al., "Binary surface-relief gratings for array illumination in digital optics", Applied Optics, vol. 31, No. 17, Jun. 1992, pp. 3320-3336.

M. Farn et al., "Dual-sided lithography: a method for evaluating alignment accuracy", Applied Optics, vol. 31, No. 34, Dec. 1992, pp. 7295-7300.

S. Arnold, "Electron beam fabrication of computer-generated holograms", Optical Engineering, vol. 24, No. 5, Sep./Oct. 1985, pp. 803-807.

F. McCormick, "Generation of large spot arrays from a single laser beam by multiple imaging with binary phase gratings", Optical Engineering, vol. 28, No. 4, 1989, pp. 299-304.

F. Clube et al., "Holographic mask aligner", Optical Engineering, vol. 32, No. 10, Oct. 1993, pp. 2403-2409.

C. Gould et al., "Overlay Measurement: Hidden Error", Proc. of SPIE, vol. 3998, Mar. 2000, pp. 400-415.

\* cited by examiner

- Alignment by attaining best concentric fit
- Z height by cone diameter
- Translation by dot vs. hole
- Rotation by mulitiple locations

METHOD AND APPARATUS FOR REGISTRATION WITH INTEGRAL ALIGNMENT OPTICS

BACKGROUND

1. Field

This invention relates generally to the manufacture of semiconductor devices, and more specifically to metrology tools used in the manufacture of semiconductor devices.

2. Background

Semiconductor metrology tools used in semiconductor manufacturing to measure and characterize wave front data generally rely on a high degree of component alignment within the tool. In general, the alignment of components within a metrology tool affect the performance of the tool. For example, if optical components within the tool are not aligned to each other correctly, optical distortions can adversely affect the tool's performance. To improve the performance of the tool, methods of characterizing component alignment have been developed, and component alignment data can be used for calibration and correction of data gathered with the tool. See, for example, U.S. Pat. No. 5,828,455 entitled "Apparatus, Method of Measurement and Method of Data Analysis for Correction of Optical System" to A. Smith et al., issued Oct. 27, 1998; and U.S. Pat. No. 6,356,345 entitled "In-Situ Source Metrology Instrument and Method of Use" to B. McArthur et al., issued Mar. 12, 2002, both of which are assigned to the assignee of the present application and are herein incorporated in their entirety.

While techniques have been developed to characterize component alignment, the techniques often require the use of optical components and equipment that are not part of the tool used to determine component alignment. It would be advantageous not to have to use additional optical components or equipment to characterize the tool.

There is, therefore, a need in the art for improving the characterization of component alignment of metrology tools.

SUMMARY

An integral alignment optic (IAO), that is part of a photolithography apparatus, such as a metrology tool, and is used to characterize alignment of components within the apparatus, or tool, is composed of two or more Alignment Component Devices (ACDs). The ACDs are positioned on two surfaces of the tool that are to be aligned, such that the ACDs overlay to form a system of alignment. A multiplicity of ACDs can be used to align any number of planes on any given substrate(s) within the tool. In its simplest form, one ACD produces a projected reference object or pattern and a corresponding ACD on a different surface acts as a target.

An IAO system can be designed, or optimized, based on parameters that can affect optical path of alignment, which may include, for example, index of refraction, thickness, pattern holding ability, and surface flatness.

Physical dimensions of the IAO and its ACDs may also depend on the illumination used to view the IAO, for example, the wavelength of a laser used to form holographic parts of the IAO, and an intended medium for capturing the alignment data.

Placement of the IAO in the system may take into consideration the alignment platform that is to be characterized. For example, the placement of the ACDs may take into consideration the particular tool to be constructed.

An alignment station can be used to provide a platform to support, for example, the physical alignment of the tool components, an illumination source, an operator viewing device such as a microscope, a laser source used to form hologram components of the IAO, and data capturing devices.

In general, physical alignment of the substrates includes the ability to move all substrates in three dimensions, and an ability to view the IAO during movement.

In one embodiment, the IAO includes a projection component with a first set of features and at least one projection alignment component device. The IAO also includes a surface with a second set of features. At least one of the features in the second set correspond to one of the features in the first set. The second surface also includes at least one target ACD; wherein the projector ACD is imaged onto the target ACD such that offsets of the projection alignment device image at the target alignment component device indicate offsets between the corresponding features on the projection component and the surfaces.

DETAILED DESCRIPTION

Outline of the General Theory

A photolithography apparatus, such as a metrology tool, can be provided with a system of Integrated Alignment Optics (IAO) that include Alignment Component Devices (ACD) which can be placed on planes or surfaces within the apparatus that wish to be aligned. Data obtained from the IAO can be used, for example, to provide data and real time feedback of alignment of components in the apparatus during assembly; as well as data that can be used to characterize global alignment of a completed apparatus assembly in terms of translation, rotation, and x, y scale.

The planes or surfaces within the apparatus that are to be aligned typically include features which are desired to be aligned. The features on each surface to be aligned are first locally characterized relative to ACDs, that are placed on the same surface as the features, in terms of translation, rotation, and x, y scale. The ACDs that are placed on the various surfaces to be aligned are positioned such that the ACDs will overlay during assembly of the apparatus to form respective IAOs. As noted, the IAOs can provide data for real time corrections to the surface-to-surface, or plane-to-plane, alignment for a single substrate tool, or substrate-to-substrate global alignment of any photolithography apparatus, such as a metrology tool. After assembly, data and images for analysis can be collected and global alignment offsets determined.

The local alignment characteristics can then be adjusted to incorporate the global alignment offsets, producing a correctional list of offsets for the features of the tool. This correctional list can then be added to the designed positions of the tool feature to produce an actual "as built" positional list of the calibrated tool, for use as a calibration file for data measured with the tool. A system of IAOs with ACDs can be used to align any number of substrates, containing any number of planes, relative to each other, to a high degree of precision, and can be used to characterize the alignment to a great degree of accuracy depending on the finalizing of the IAO system itself.

First Embodiment

A simple and accurate methodology for aligning two surface planes, each contained on two separate substrates, is described. A first substrate may be, for example, a fused silica reticle commonly used in microlithography. Typically, the reticle will be capable of holding features at about a one micron level, and is produced to accuracy with sub-micron tolerance. The reticle can include ACDs, for example, a hologram producing ACD.

Figure 1:
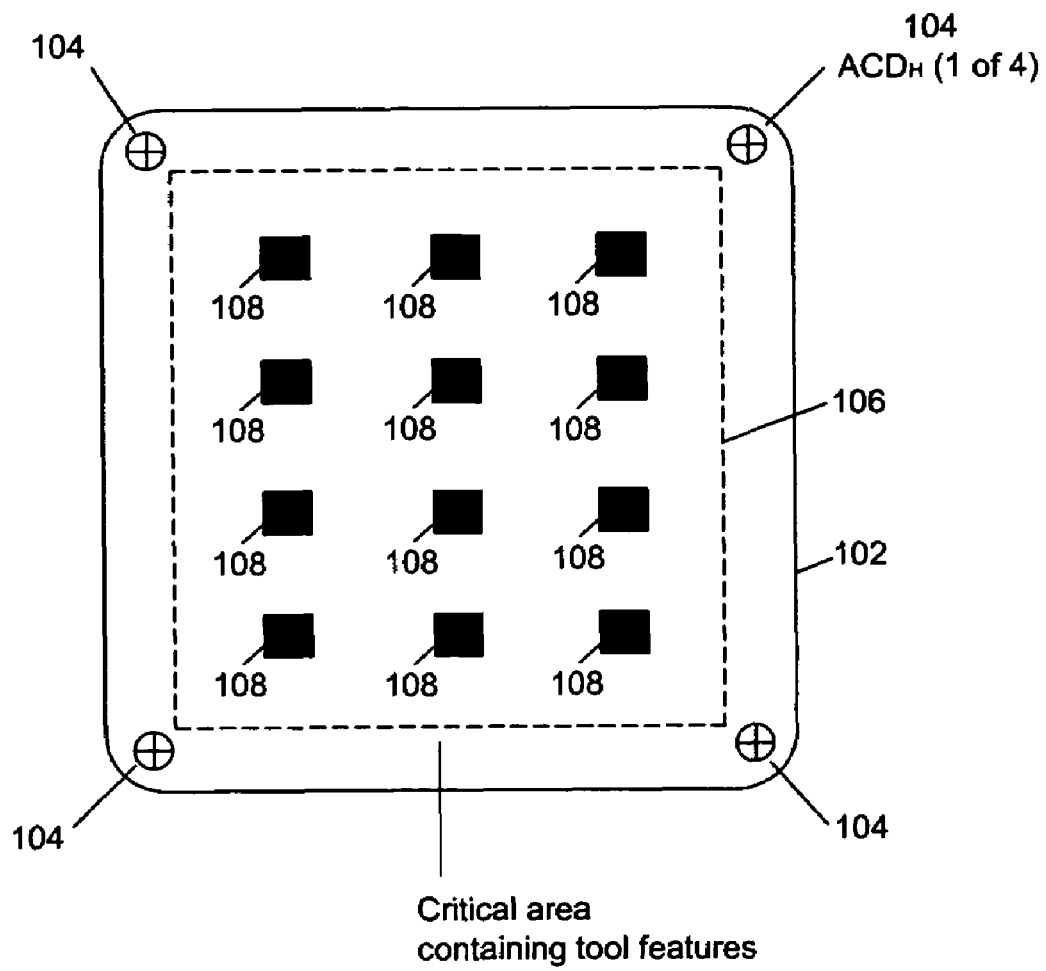
FIG. 1 is a diagram illustrating a reticle in accordance with the invention showing the location of four ACDs in relation to a critical area of the reticle containing tool features.

FIG. 1 is a diagram illustrating a substrate, in accordance with the invention, showing the location of four ACDs in relation to a critical area of the substrate containing tool features. As shown in FIG. 1, a first substrate, for example a reticle 102, includes four projector $ACD_P$ 104, one located at each corner of the reticle 102. The $ACD_P$ 104 are located outside of a critical area 106 of the reticle 102. The critical area 106 is a region of the reticle 102 where features 108, which are desired to be aligned within a lithographic device such as a metrology tool, are located.

Figure 2:
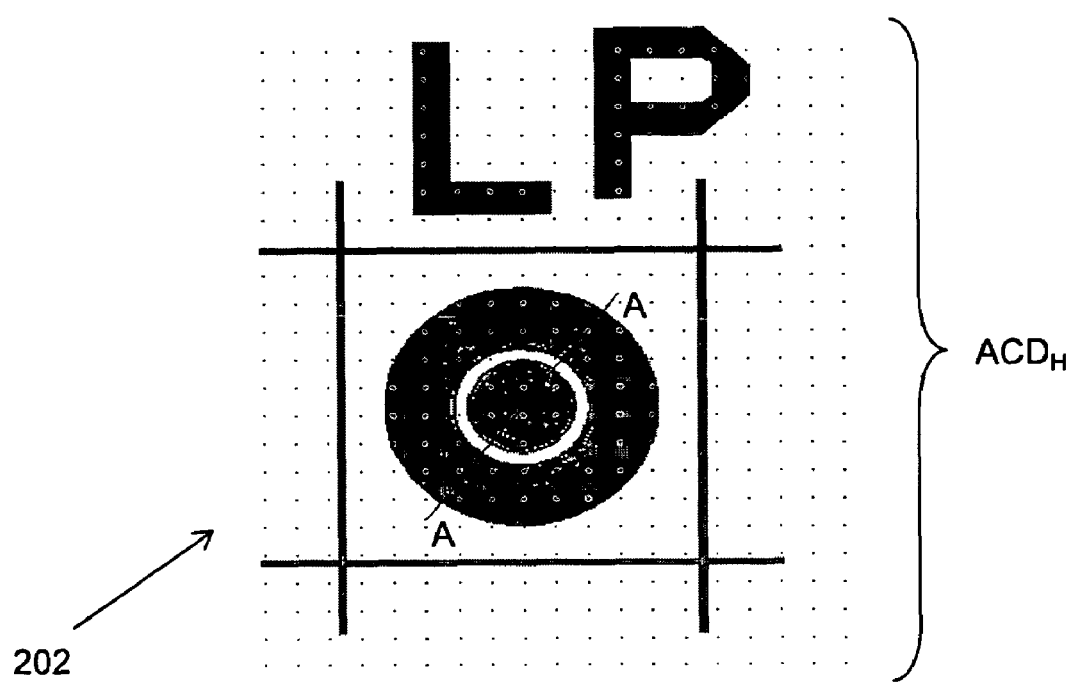
FIG. 2 is a diagram illustrating an example of a projector ACD optical element which is a computer generated hologram consisting of a series of concentric rings which vary in periodicity.

FIG. 2 is a diagram illustrating an example of a projector $ACD_P$ optical element, made up of a series of concentric rings which vary in periodicity, and produce a hologram image when exposed. The hologram producing projector $ACD_p$ 202 shown in FIG. 2, projects a reference hologram that is part of an IAO system. The reference hologram may be projected from a first substrate of surface (e.g. the reticle of FIG. 1) onto a second surface. An example of a second surface may be, for example, a 2 mils (0.002") thick metal sheet wet-etched with an array of holes that will be used by an intended metrology tool. Such a second surface may be used as a component of a metrology tool where it is usually called an Aperture Plate (AP).

Figure 3:
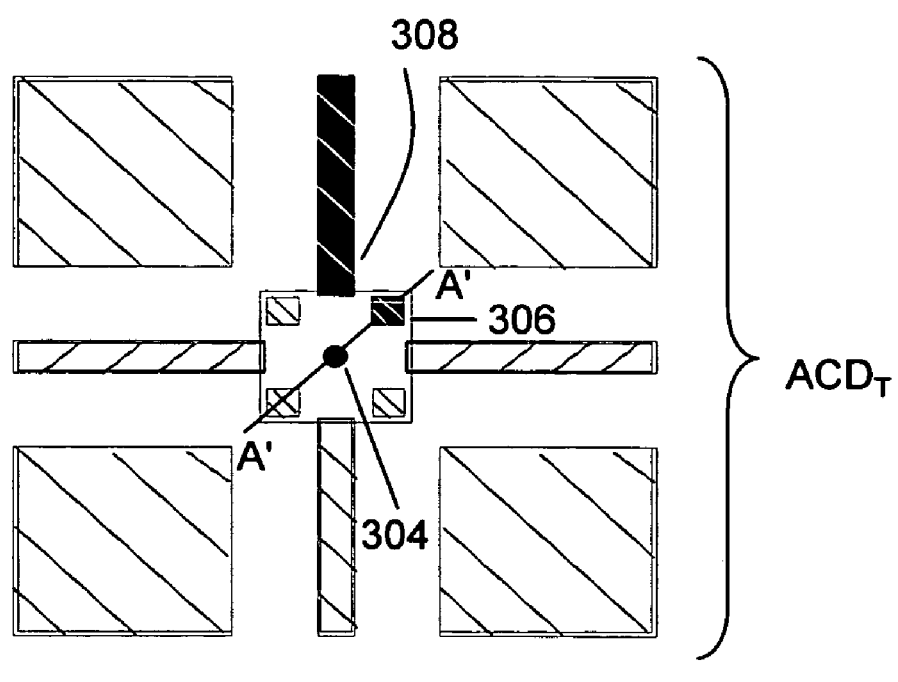
FIG. 3 is a diagram illustrating an example of an IAO reference pattern, or target ACD.
Figure 4:
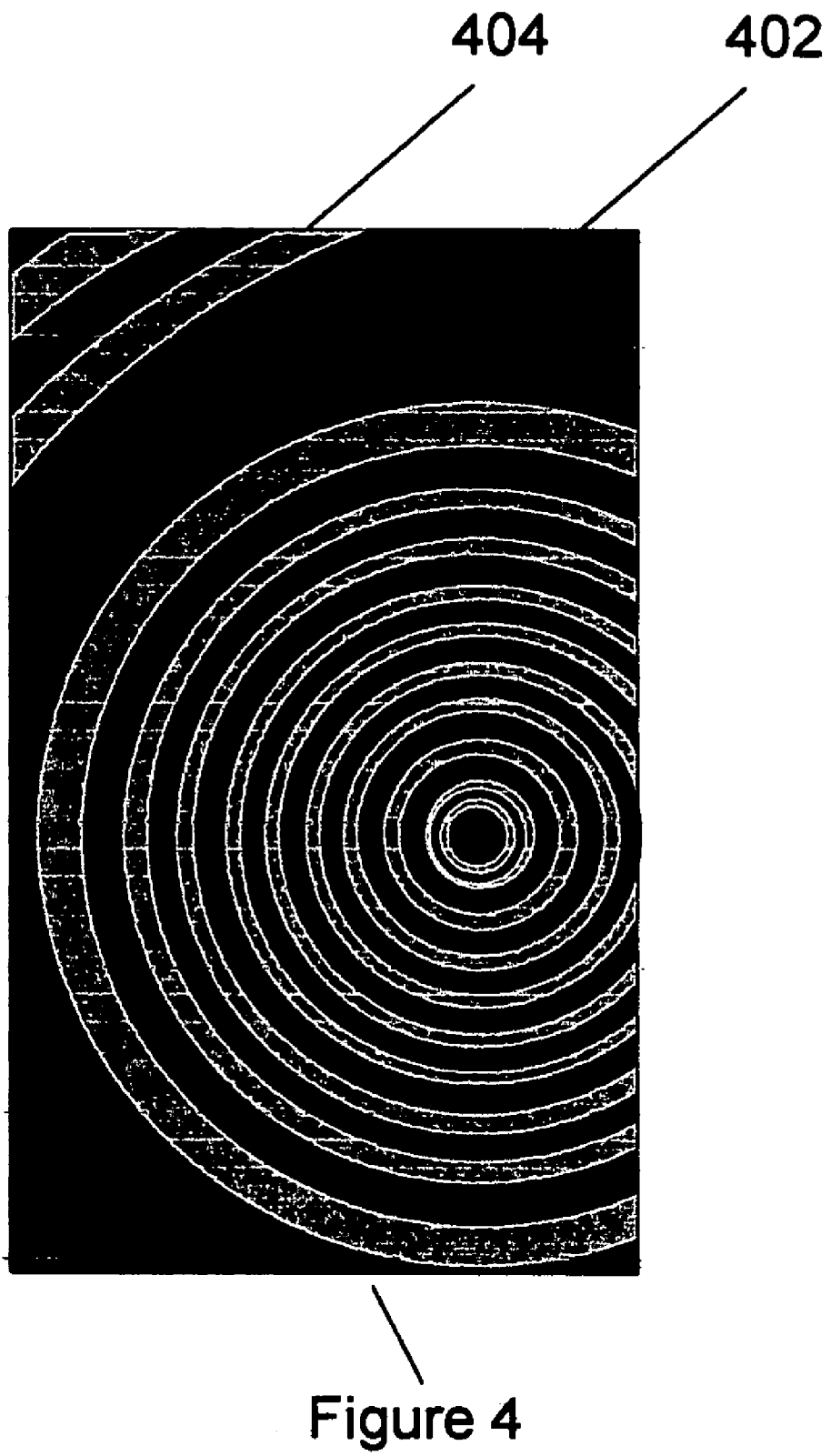
FIG. 4 is an expanded view of the projection ACD optical element of FIG. 2.

The second substrate, for example, an AP, may include the IAO system's target Alignment Component Devices ($ACD_T$), which are designed and fabricated to overlay the projected reference structure of the projector $ACD_P$, for example a hologram produced by a projector $ACD_P$. FIG. 3 is a diagram illustrating an example of an IAO reference pattern, or target ACD 210. FIG. 4 is an expanded view of the projector $ACD_P$ diagram optical element, of FIG. 2. As shown in FIG. 4, the $ACD_P$ has a center set of concentric rings 402 surrounded by a set of larger concentric rings 404.

Figure 7:
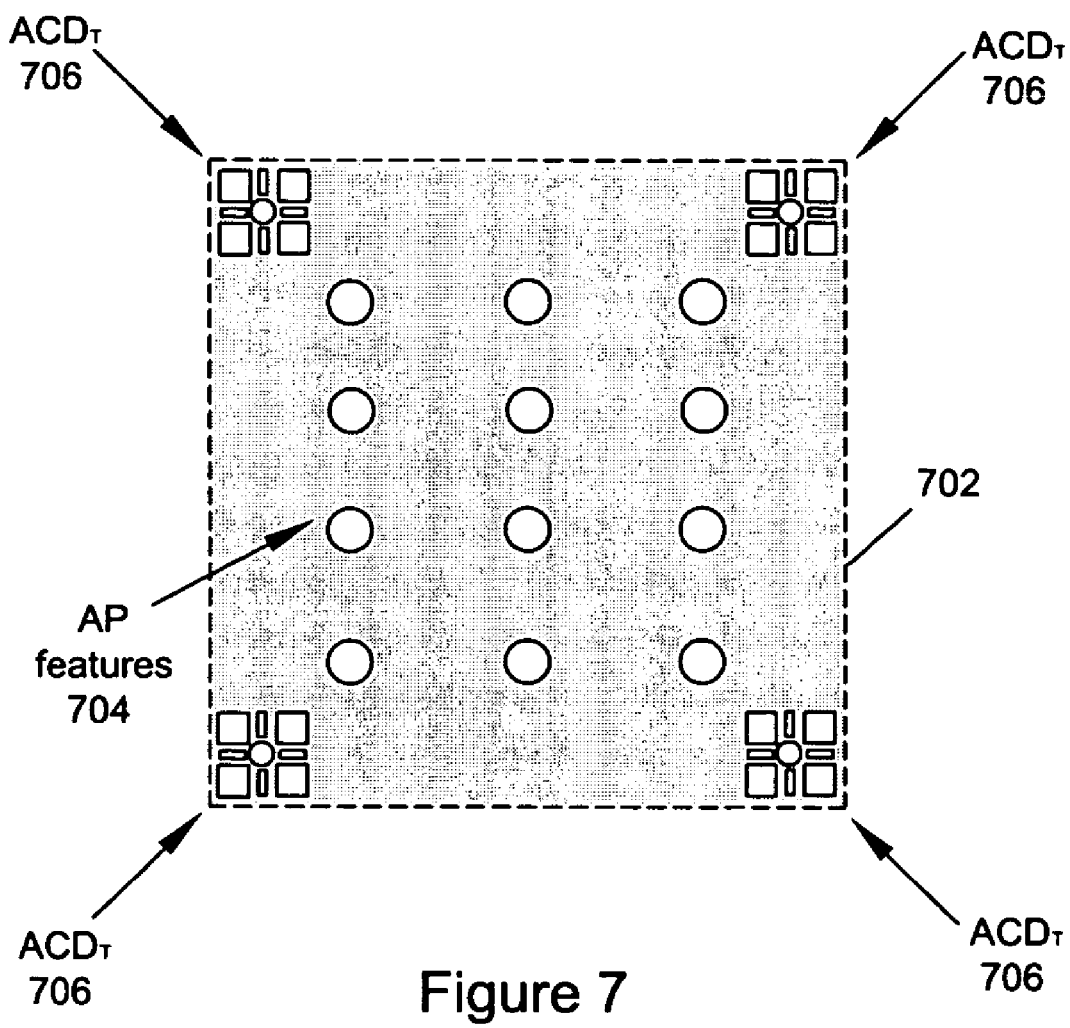
FIG. 7 is a diagram illustrating an example of an aperture plate (AP) with four target ACDs at four corners.

FIG. 7 is a diagram illustrating an example of an AP with four target $ACD_T$ at four corners. As shown in the example of FIG. 7, the aperture plate 702 includes an array of aperture features 704, for example, holes and four target $ACD_T$ 706, one at each corner of the aperture plate.

Figure 5:
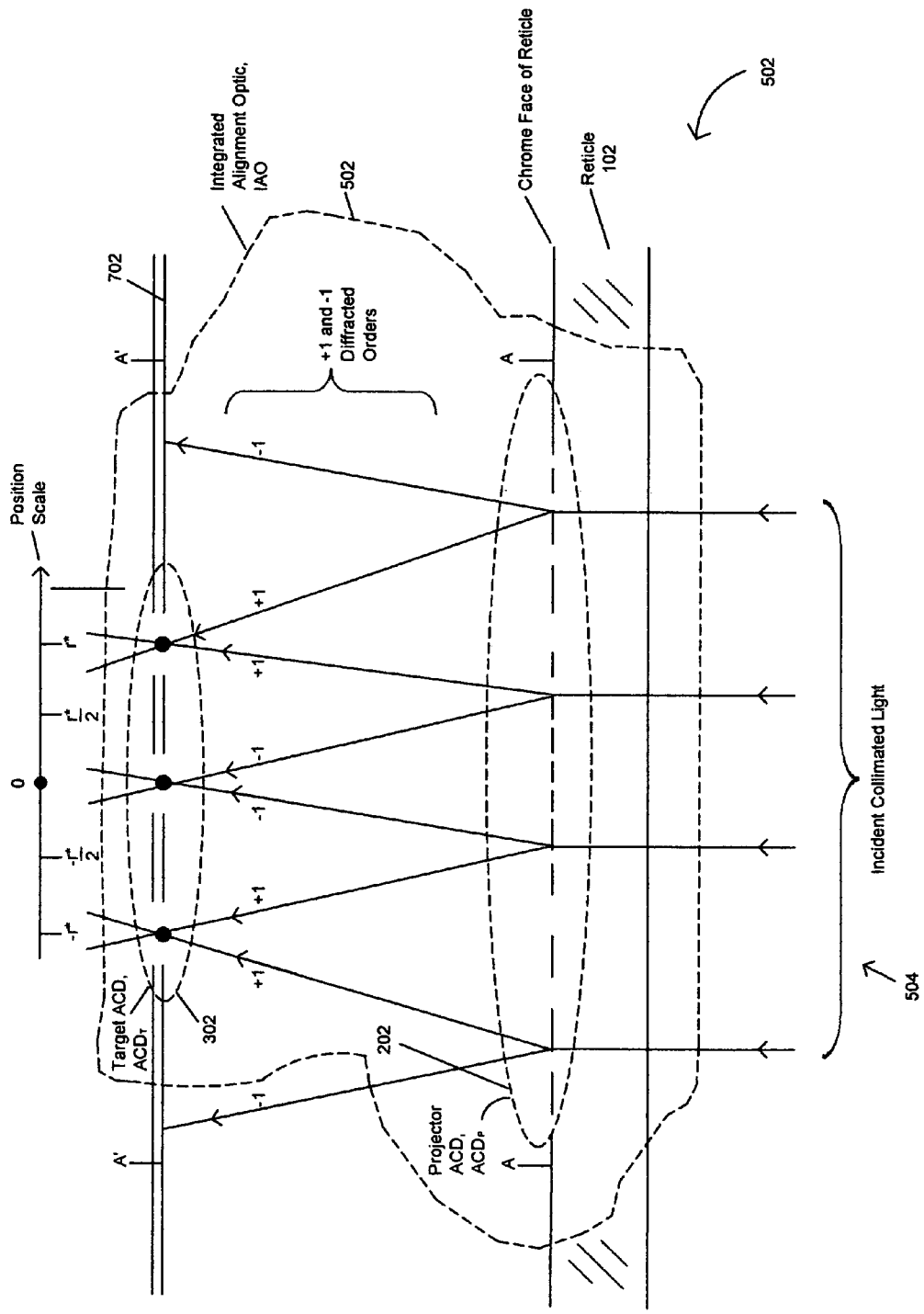
FIG. 5 is a diagram showing a cross section and ray trace diagram for an exemplary IAO.

FIG. 5 is a diagram showing a cross section and ray trace diagram for an exemplary IAO. As shown in FIG. 5, an Integral Alignment Optic (IAO) 502 includes a projector $ACD_P$ and a target $ACD_T$. For example, the projector $ACD_P$ may be located on a subtrate, such as a reticle 102, and the target $ACD_T$ may be located on a second substrate, such as an aperture plate, 702.

For example, FIG. 5 can represent the reticle 102 shown in FIG. 1. On the reticle 102 are placed projection $ACD_P$, for example the projection $ACD_P$ 202 shown in FIG. 2. The $ACD_p$ of FIG. 2, when exposed by collimated light 504, produces an image, such as a hologram, on an AP 702 as shown in FIG. 7. The AP 702 includes a target $ACD_T$, for example, the target $ACD_T$ 302 of FIG. 3. In other words, in this example, a reticle 102 includes projector $ACD_P$ 202 that are exposed. The exposed $ACD_P$ 202 produces an AP 702 that includes $ACD_T$ 302.

Figure 13:
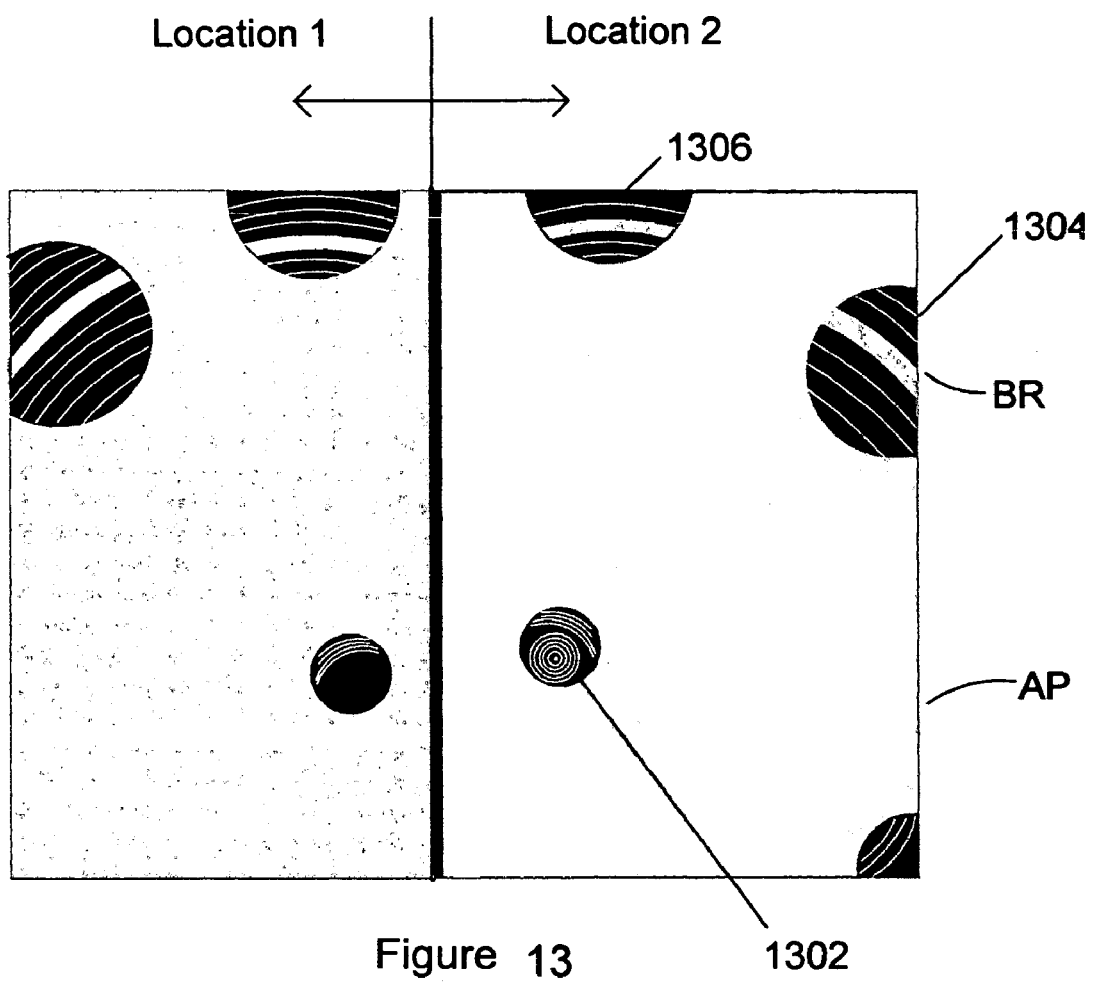
FIG. 13 is an illustration showing an example of a projector ACD pattern onto a target ACD.

FIG. 13 illustrates the image of the projection $ACD_P$ 202, located on the reticle 102, as viewed through the target $ACD_T$ in the AP 702 and includes a left side image and a right side image. As shown in FIG. 13, there is an image of a center spot 1302 from the projector $ACD_P$ 202 central set of concentric rings 402 as viewed through a central hole 304 in the target $ACD_T$ 302 (see FIGS. 2, 3, and 4). Also shown in FIG. 13 is an image of the projector $ACD_P$ outer set of concentric rings 404 as viewed through the target $ACD_T$. In FIG. 13, regions 1304 and 1306 correspond to the image of the outer ring of the image produced by the projector $ACD_P$ viewed through openings 306 and 308 of target $ACD_T$ respectively. The image illustrated on the left side of FIG. 13 corresponds to a different pair of projector $ACD_P$ and target $ACD_T$, as described further below. The location of the outer rings in the $ACD_P$ openings, for example openings 306 and 308 producing images 1304 and 1306 respectively, can be used for a coarse alignment of the surface containing the projector $ACD_P$ to the surface containing the target $ACD_T$. The location of the central spot from the projector $ACD_P$ can be used for fine alignment of the two surfaces.

Figure 14:
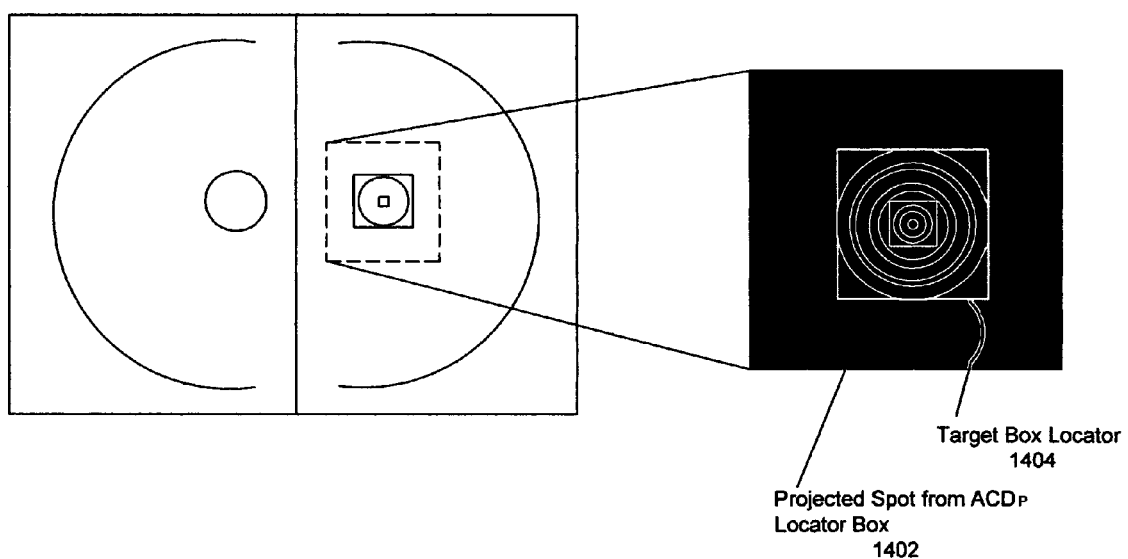
FIG. 14 is an illustration showing an expanded view of a projected spot onto a target ACD.

FIG. 14 illustrates an expanded view of the central spot 1302 of the projector $ACD_P$ 202 central set of concentric rings as viewed through the central hole 304 of the target $ACD_T$ 302. The location of the center of the projected spot 1402 is measured in reference to a target box 1404 corresponding to the location of the central hole 304 of the target $ACD_T$ 302. Measurement of an offset of the center of the projected spot 1402 from the center of the target box 1404 corresponds to the offset between the two surfaces containing the projector $ACD_P$ and the target $ACD_T$.

Figure 6:
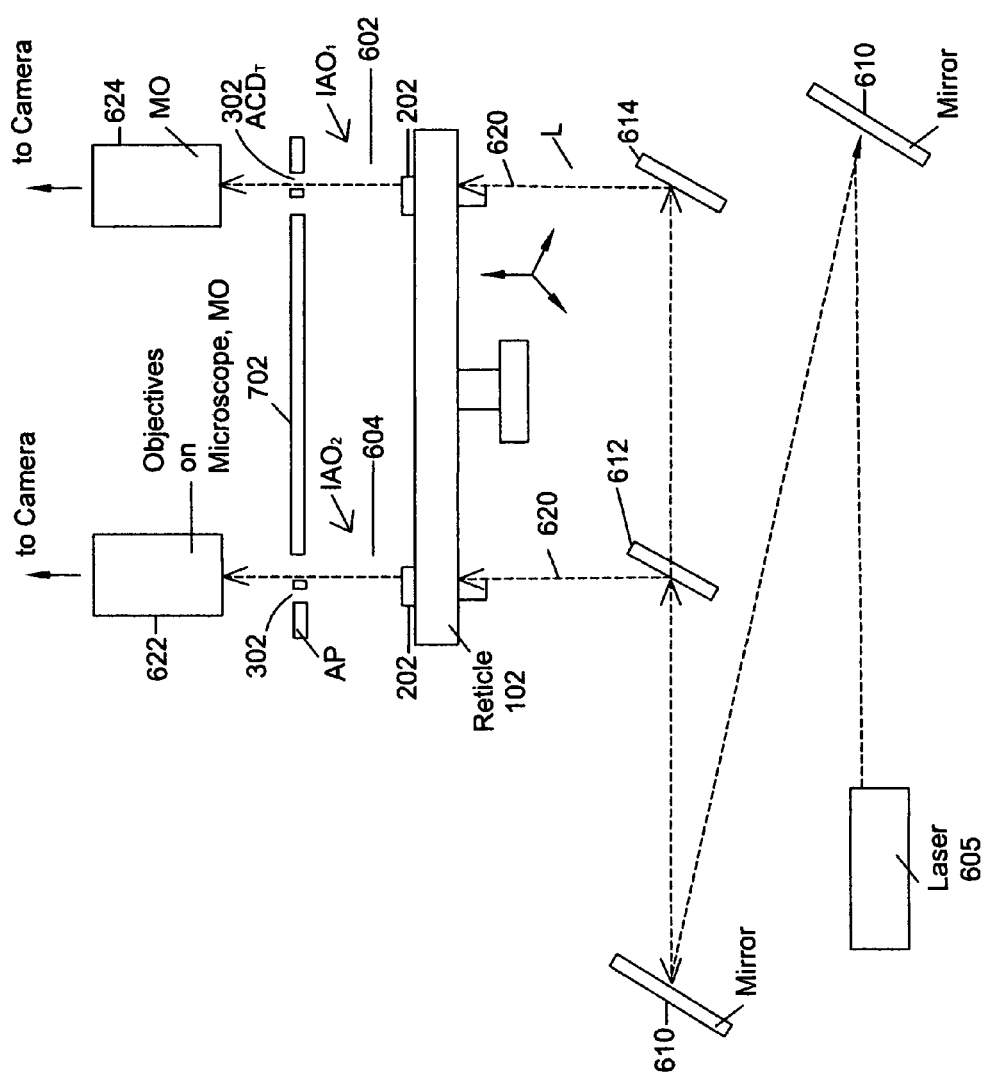
FIG. 6 is a block diagram illustrating the IAO system on a laser alignment station.

FIG. 6 is a block diagram illustrating the IAO system on a laser alignment station. The example illustrated in FIG. 6 is of a system with two IAOs 602 and 604. In another embodiment, the system includes four IAOs, with corresponding projection ACDs and target ACDs located at each of the four corners of each of the two substrates, outside of the critical areas of a lithography device, such as a metrology tool.

For example, FIG. 6 can represent a laser alignment station that includes a laser 602 that produces a light source, that passes through optical devices, as described below, and is incident on a reticle, for example the reticle 102 shown in FIG. 1. On the reticle 102 are placed projector $ACD_P$, for example, the projection $ACD_P$ 202 shown in FIG. 2. The $ACD_P$ of FIG. 2, when exposed by the light, produce a hologram image on an AP 702 as shown in FIG. 7. The AP 702 includes target $ACD_T$, for example, the target $ACD_T$ 302 of FIG. 3. In other words, in this example, a first surface includes a projector $ACD_P$ 202 that is exposed. The exposed $ACD_P$ 202 produces a hologram image at a second surface that includes a $ACD_T$ 302. Measurement of the image of the projector $ACD_P$ onto the target $ACD_T$, as described in connection with FIGS. 13 and 14 above, and further below, can be used to determine an offset between the two surfaces.

Figure 8:
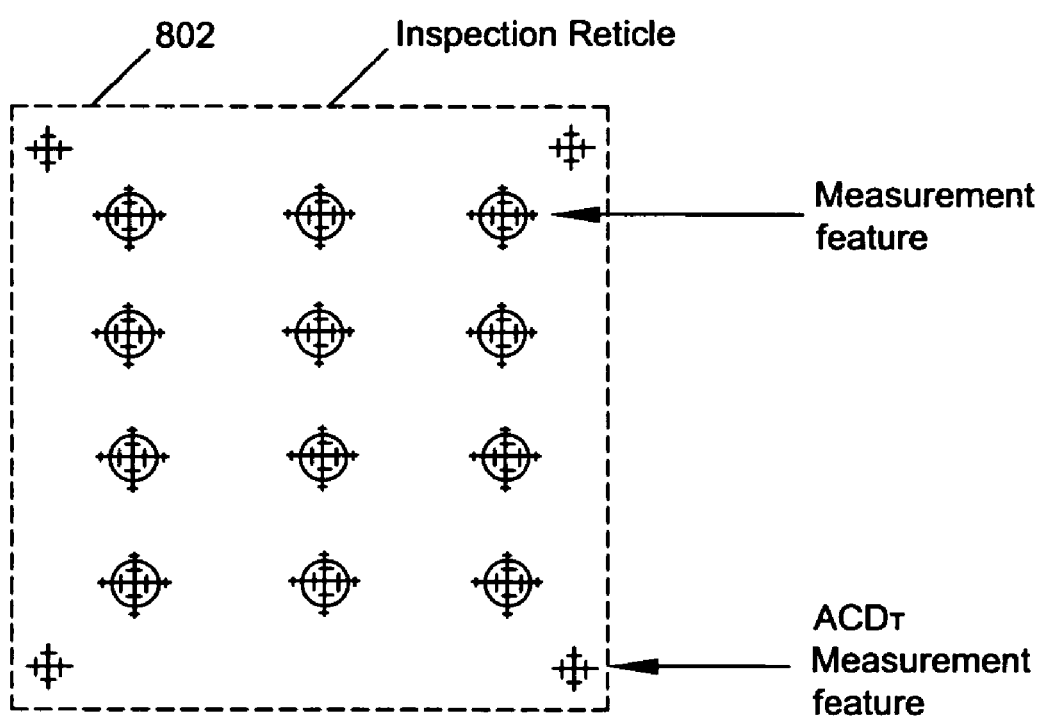
FIG. 8 is a diagram illustrating an example of an inspection reticle.

Before alignment of substrates, or surfaces, on an alignment station, individual features contained on each substrate are characterized relative to the respective ACD found on the substrate. In the case of a reticle, this may require that the feature placement be verified by the reticle fabricator to meet specification. Typically, the placement of features on a reticle are accurate enough that errors in the pattern contained on the reticle can be neglected for purposes of alignment. In the case of an Aperture Plate, a separate inspection reticle may be produced with measurement features specifically designed to be used to visually verify the aperture plate feature positions including the preferred $ACD_T$ center. FIG. 8 is a diagram illustrating an example of an inspection reticle 802.

Figure 9:
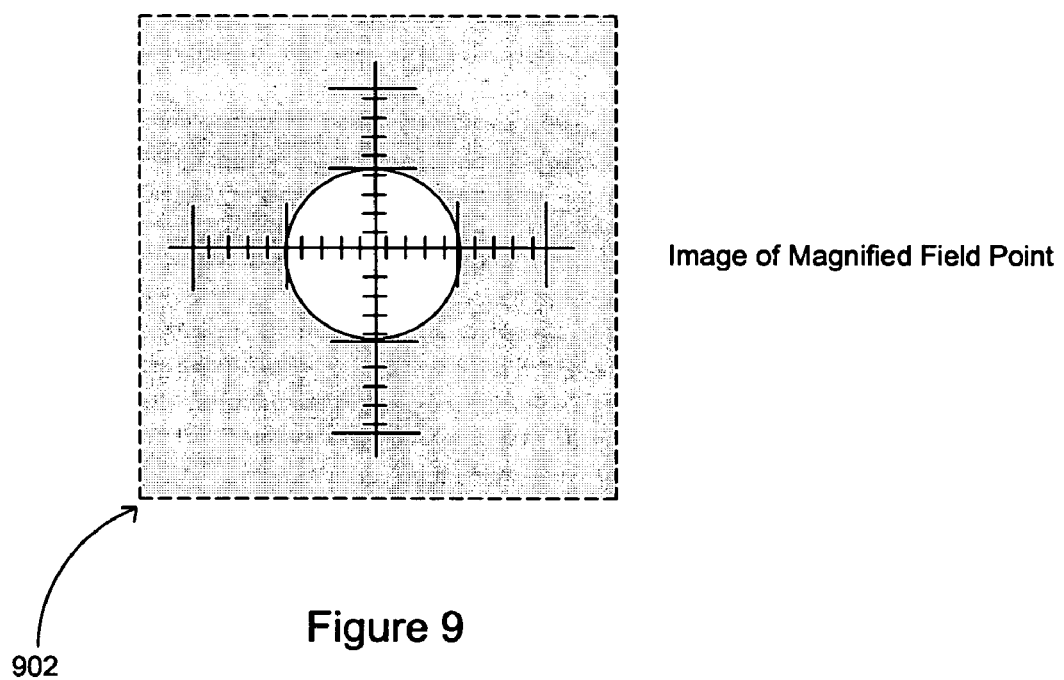
FIG. 9 is a diagram illustrating an exemplary technique for measuring the registration of a hole in an AP overlapping with an inspection reticle.

The inspection reticle 802 may be placed over an AP, for example, the AP 702 in FIG. 7, and then positioned under a microscope equipped with an image capture system. Images may then be captured of the measurement features of the inspection reticle overlay with the aperture holes. FIG. 9 is a diagram illustrating an exemplary technique for measuring the registration when a hole 704 from AP 702 overlaps with inspection reticle 802. Shown in FIG. 9 is an illustration of an image 902 of a magnified field point. Positional (x,y) offsets, as captured on the images, can then be assigned for the features of the AP relative to the designed positions represented by the measurement feature centers. These positional offsets are collected on a list of fiducials used for calibrating the AP. Equations 1-8, listed below, describe computations related to the listed fiducials to characterize the AP in terms of x, y translation, rotation, and x, y scale or magnitude. In the equations, nominal values, $(X_i, Y_i)$ are positional values determined by system design. The values $(dX_i, dY_i)$ are measured offsets, which are positional errors taken from images. Translation, $T_x, T_y$, is found and removed by subtracting the average $(dX_i, dY_i)$ offsets from their respective nominal values.

$$dX_i' = dX_i - \langle dX_i \rangle, \text{ where } T_x = \langle dX_i \rangle \quad \text{Equation 1}$$

$$dY_i' = dY_i - \langle dY_i \rangle, \text{ where } T_y = \langle dY_i \rangle \quad \text{Equation 2}$$

and $\langle \ \rangle$ denotes the average of the respective braced quantity.

Rotation, Q, is removed at each point using the following equation:

$$Q = \frac{\langle X_i * dY_i' - Y_i * dX_i' \rangle}{\langle X_i^2 + Y_i^2 \rangle} \quad \text{Equation 3}$$

Rotational error is removed from Equations 1 and 2:

$$dX_i'' = dX_i' + Y_i * Q \quad \text{Equation 4}$$

$$dY_i'' = dY_i' - X_i * Q \quad \text{Equation 5}$$

Scale or Mag, S, is computed by the following equation:

$$S = \frac{\langle X_i * dX_i'' + Y_i * dY_i'' \rangle}{\langle X_i^2 + Y_i^2 \rangle} \quad \text{Equation 6}$$

Scale error is removed from Equations 4 and 5:

$$dX_i''' = dX_i'' - S*X_i \quad \text{Equation 7}$$

$$dY_i''' = dY_i'' - S*Y_i \quad \text{Equation 8}$$

RMS is calculated with the following equation:

$$RMS = \langle dX_i'''^2 + dY_i'''^2 \rangle^{1/2} \quad \text{Equation 9}$$

The corrected values computed:

$$X_{c,i} = X_i + dX_i''' \quad \text{Equation 10}$$

$$Y_{c,i} = Y_i + dY_i''' \quad \text{Equation 11}$$

Equation 9 is a standard equation used to find the RMS of the fiducials. The use of the inspection reticle characterizes the AP with an RMS of approximately one micron.

After both substrates are fully characterized, they can be placed on a laser alignment station. Typically, the laser alignment station includes a stage capable of moving in three dimensions upon which the reticle is attached.

Figure 11:
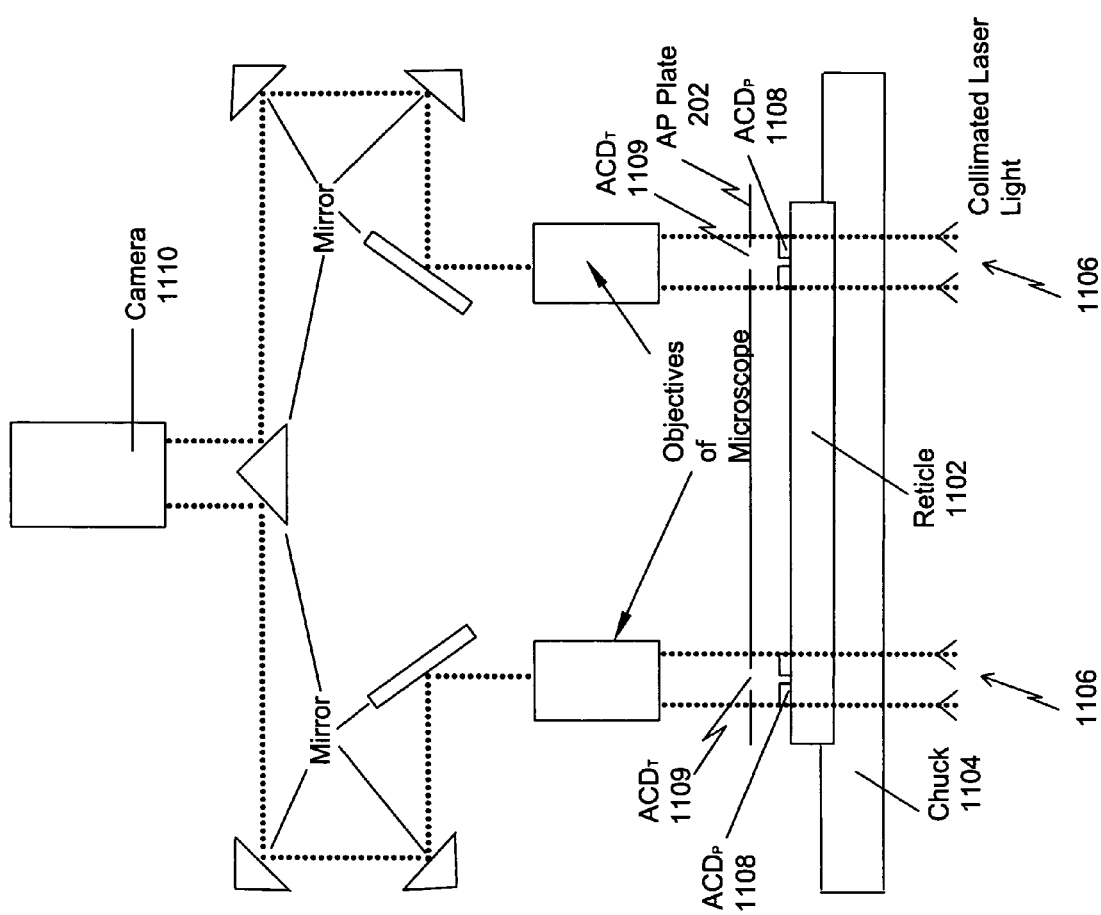
FIG. 11 is a block diagram illustrating an example of a laser alignment system.

FIG. 11 is a block diagram illustrating an example of a laser alignment system. As shown in the example of FIG. 11, a reticle 1102 is placed in an alignment chuck 1104 and collimated laser light 1106 is made incident on it. The reticle 1102 is transversely (x and y) shifted until the projected reference pattern from the two projection $ACD_P$ 1108 show up in a central location within the camera 1110 field of view.

Figure 12:
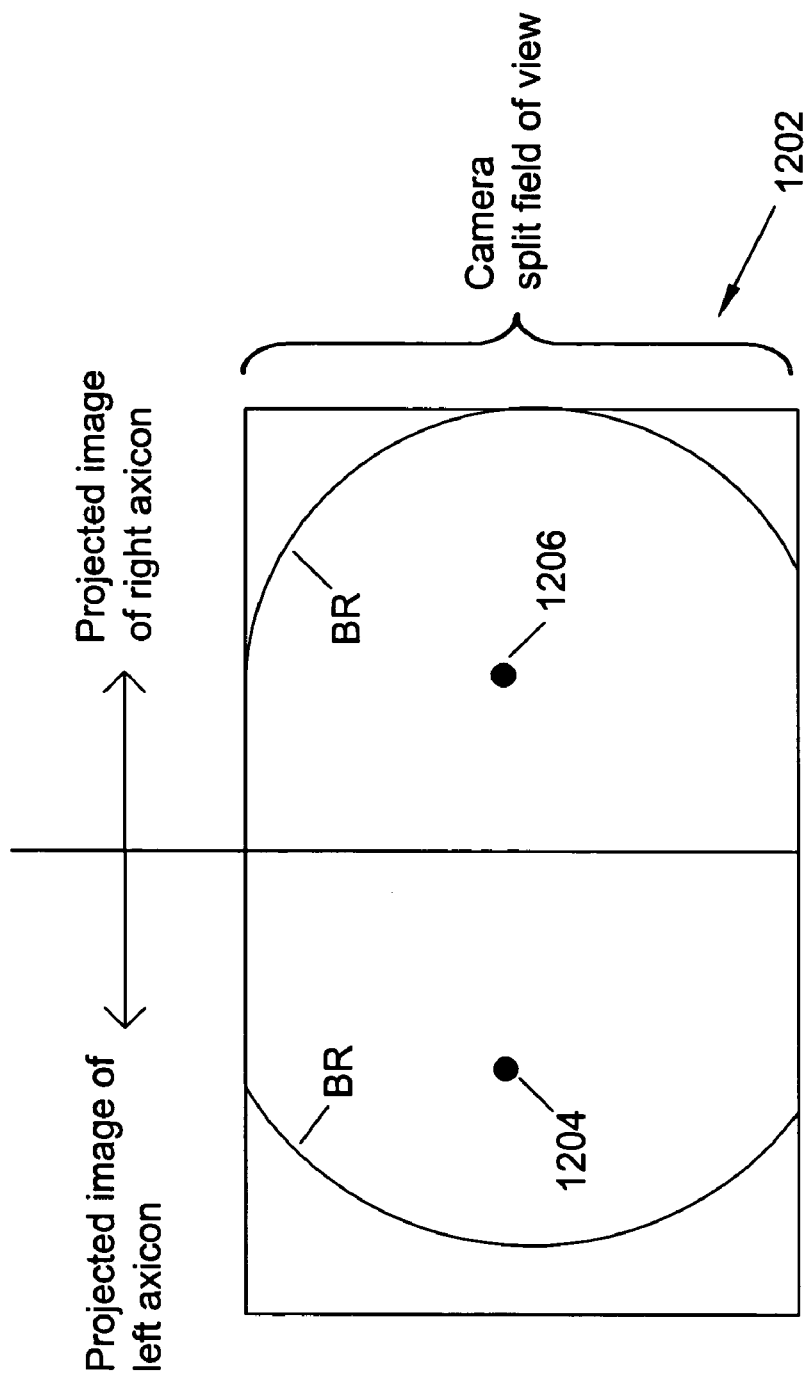
FIG. 12 is a schematic showing a split field image from two IAOs.

FIG. 12 is a schematic showing a split field image 1204 and 1206 from the two $ACD_P$ 1108 as viewed at the camera 1110. Referring again to FIG. 11, collimated laser light is back reflected and adjusted to be normally incident on reticle backside. Next, and referring to FIG. 6, aperture plate AP 702 is suspended above the reticle 1108 on an elevated arm (not shown).

Figure 10:
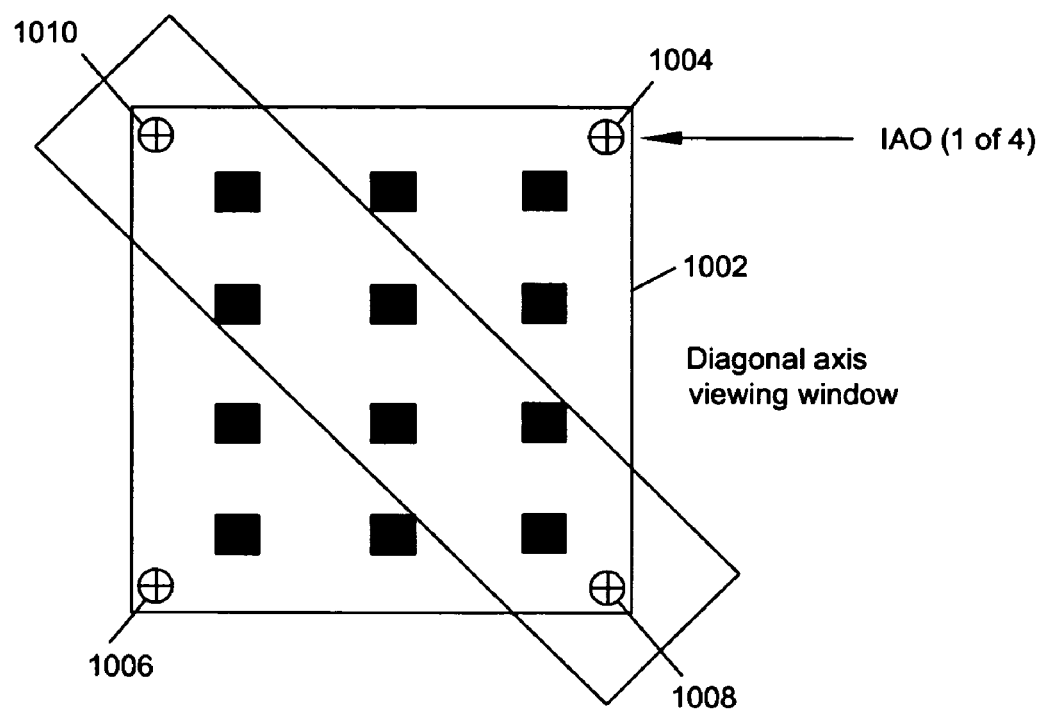
FIG. 10 is a diagram illustrating a technique of measuring ACDs located diagonally.

FIG. 10 is an illustration showing different combination of ACDs that can be used for alignment. In the example illustrated in FIG. 10, there are four ACDs, one at each corner of a reticle 1002. Any combination of ACDs can be used for alignment. For example, if two ACDs are used they can be adjacent, such as pairs 1006 and 1008, or 1004 and 1008, or 1008 and 1010, or 1010 and 1006. In addition, ACDs that are located diagonally to each other can be used, for example pairs 1006 and 1004, or 1008 and 1008. It is envisioned that any number of ACDs may be used in any combination in accordance with the techniques described.

The image of the projector $ACD_P$ as viewed through the target $ACD_T$, along with white light illumination fed into the microscope objective via prisms, is used to coarsely align the two substrates in x, y. As described above, FIG. 13 is an illustration showing an example of a projected reference pattern, that is a spot centered in a ring, centered directly over an ACD origin on a first surface capturing two images simultaneously, at separate locations. The substrates may be brought in close to the desired Z alignment, for example about 5 mm for a metrology tool, during coarse alignment to keep the camera image (FIG. 13) in focus. The laser beam is then made orthogonal to the reticle surface in a process called back reflecting (see FIG. 6 for setups). In the example of FIG. 6, the laser beam is reflected by mirrors 610 to lengthen the beam path to approximately 12 feet, then split with a prism 612 into two beams which are reflected by the prism 612 and an additional mirror 614 into each of the IAOs in the viewing window. Back reflecting seeks to place the portion of the laser beam reflected by the reticle surface back into the laser beam's point of origin. Back reflecting involves manipulating all the mirrors in the laser beam path so that all laser light is reflected back upon itself and all the way back into the laser emitter. Back reflecting ensures that the projected reference image is fully formed at the intended 3D spatial location within each IAO.

After back reflection is completed, fine alignment may be accomplished by moving the stage and reticle, so that a well centered image is formed in x and y. Then the reticle may be moved in the Z direction, closer to the aperture plate, which will deform the projected image in an iterative real-time process until the reticle and aperture plate contact or reach the desired spacing at which they may be secured.

When the desired spacing between the reticle and AP is reached, by fine alignment, the two parts are glued together. After curing, the assembled unit is placed in the analysis station of FIG. 6 and the IAOs illuminated with back reflected, collimated laser light, L 620, and the microscope objectives, MO 622, focused on the target $ACD_T$ located on aperture plate AP 702. At this point, images may be captured at all $ACD_T$ locations; and back reflection is performed at each location. The captured images can include, for example, digitized images such as JPEG or bitmap data. An example of a captured image is illustrated in FIG. 13, in which the dark part is from $ACD_T$ on the AP, the series of concentric rings in the small hole and the outer bright ring, BR, is the projected reference image from the projector $ACD_P$, or axicons. These images are then analyzed using any commercially available software program, such as MICROSOFT VISIO, that can assign positional values to the captured images and thereby facilitate image analysis. FIG. 14 is an enlarged image of center hole from AP and center of the projected image. It shows the Visio image of ACD with one square set at the outer circle, which is a hole from AP (a center hole in FIG. 3), and another smaller square set at the center of ACD from reticle (see FIG. 2).

The positional values of the centers of these two squares are compared to determine the location of the ACD from AP relative to ACD location on reticle. The location data gathered from the image-capturing program is then converted from the program's dimensions to the actual dimensions (real global units) using the known feature dimensions such as the radius bright ring, BR (FIG. 13). When all the images are captured and analyzed, the data from four locations on reticle (or AP) are used to calculate the global offsets in registration, in terms of translation, rotation, and x, y scaling (or magnification). The same equations used to calculate the offsets for AP locations relative to inspection reticle (Equations 1-11) are used to calculate the global offsets in reticle-to-AP alignment.

All the calculations can be performed in a spreadsheet workbook data of a computer program. The inputs for the workbook program include the raw data from the calibration test using an inspection reticle (local offsets of individual surfaces), the raw data from the registration test using back reflecting (real global offsets), and conversion parameters between Microsoft Visio (or other software) dimensions and the real global units. The gathered real global offsets are incorporated into previously measured local offsets of the individual surfaces. After all the required inputs for the calculations in the workbook are entered, the workbook computer program outputs a calibration file that lists corrected positional values of the feature-to-feature alignment. The calibration file can then be used to compensate for the registration errors due to the tool assembly. For example, the calibration file data can be used by software that operates the lithography apparatus, or chip manufacturers' software, to compensate for the registration errors due to the tool assembly. Without the calibration file, one would not be able to distinguish the registration errors due to the process itself or due to the tool assembly. By separating these errors, one could characterize the process more precisely.

Figure 15:
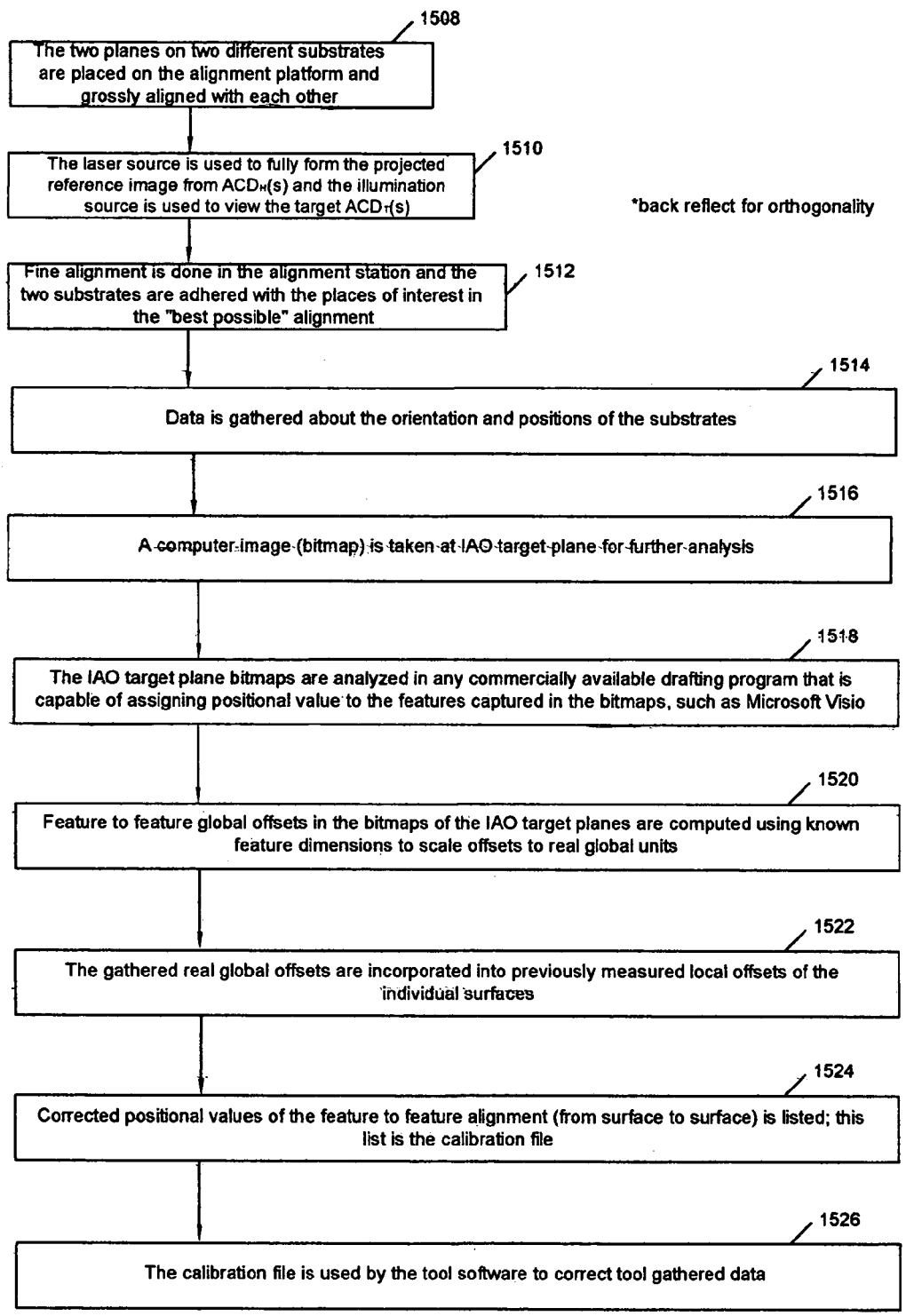
FIG. 15 is a flowchart illustrating an exemplary method for determining registration.

FIG. 15 is a flow diagram illustrating an embodiment of the process described above. Flow begins in block 1508 where two planes of two different substrates, or components, that include IAO are placed on an alignment platform. One of the planes includes projection, for example, projector $ACD_P$ placed on it at desired locations, such as at the corners of the plane. For example, the $ACD_P$ could produce a hologram. The second plane includes target $ACD_T$ placed on the second plane in locations corresponding to the location of the projector $ACD_P$. The two planes, on the alignment platform, undergo an initial, or gross, alignment. Flow continues to block 1510 where an illumination source, for example a laser source, is used to form an image of the projection $ACD_P$ and the illumination source is used to view the target $ACD_T$. In block 1512 fine alignment is performed. Following the fine alignment, the two substrates are adhered with the places of interest in the "best possible" alignment.

In block 1514 data is gathered about the orientation and positions of the substrates. Flow continues to block 1516 and a computer image is taken at the IAO target plane. In block 1518 the IAO target plane images are analyzed and positional values assigned to the features captured in the image. In block 1520 feature-to-feature global offsets are incorporated into previously obtained local offset of the individual surfaces. In block 1522 the global offsets are incorporated into local offset of the individual surfaces. In block 1524 a calibration file of corrected positional values of the feature-to-feature alignment is built. In block 1526 the calibration file is used to correct data gathered by the tool.

Second Embodiment

A second embodiment is a variation that may produce a more accurate calibration file by effectively removing back reflection error from the inputs found in the images gathered after curing. In this high accuracy method, back reflection is performed only once at one location only. After ensuring the beam starts perpendicular to the reticle surface, images of four ACDs are captured, using the same method as the previous, by moving only in X and Y directions. After capturing a first set of images, the tool (or assembled unit) is rotated 180 degrees. The same four ACDs are then captured again producing a second set of images. These two sets of images are individually analyzed as described above, but each ACD location will now have two diametrically captured registration images and offsets. After accounting for the orientation induced (from microscope objective and 180 degrees rotation) differences the error caused by back reflection can be removed by adding or subtracting (depending on orientation) the gathered offset pairs of each ACD location. Because there are more data points, there is a different workbook that calculates and removes back reflection error out of the workbook inputs. The equations used in this method are the same as the previous method (Equations 1-8). The outputs from the high accuracy workbook are also entered into the software to compensate the offsets due to the tool assembly.

Further Embodiments

Further embodiments, described below, provide additional aspects for the physical structure of the IAO. IAO variation can accommodate varying substrates and can be tailored to a specific application emphasis because a given IAO is not limited in number or size, and can be used simultaneously with other IAO designs.

Generally, the further embodiments described below will provide aspects that may improve case of alignment, or offset gathering for translation, rotation, scale, or some combination thereof.

Figure 16:
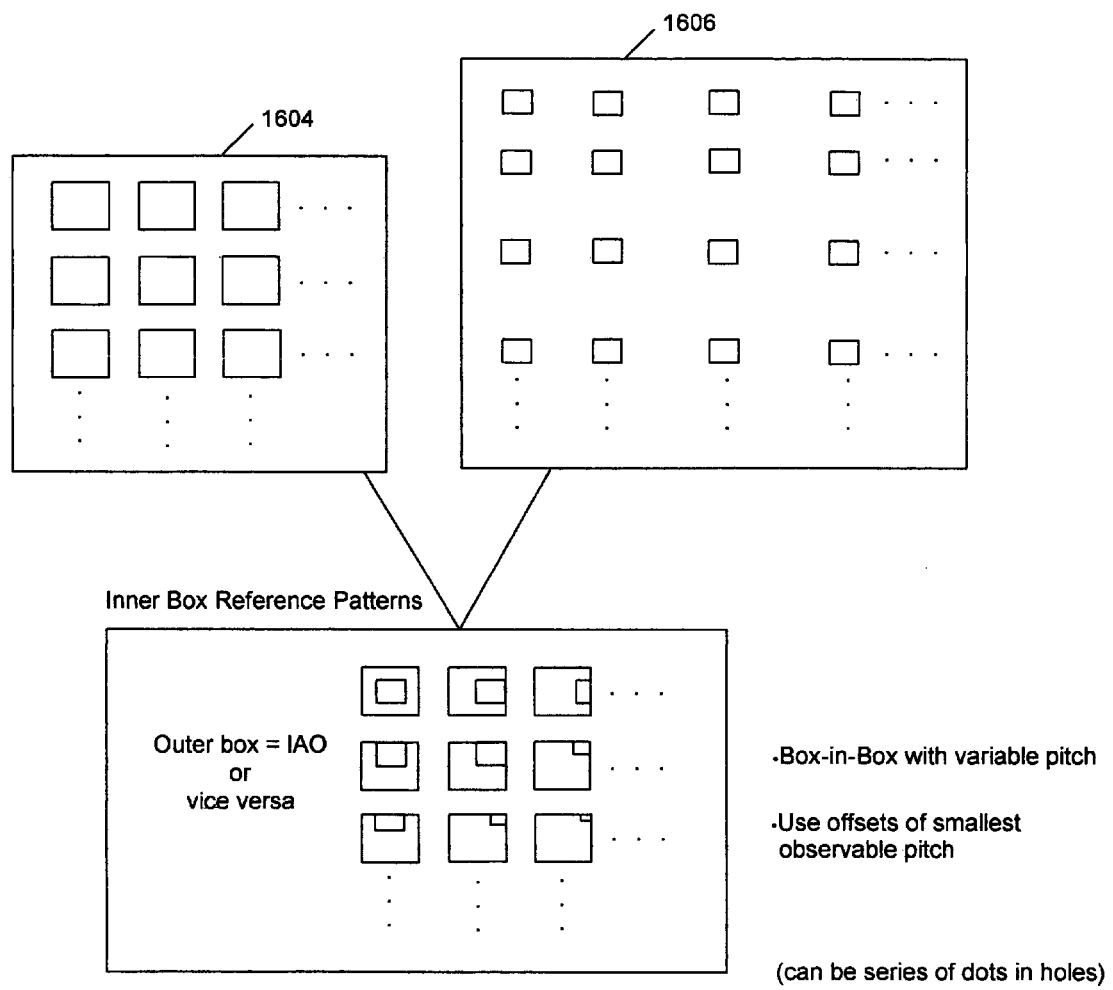
FIG. 16 is a schematic diagram illustrating how a shot gun method or vernier technique works.

There are other ways to overlap the two features, instead of using one hologram and one feature (like a hole in AP). FIG. 16 is a schematic illustrating a shot gun method or venire technique works. As shown in FIG. 16, box-in-box structures are used. In this example, one plane would have reference patterns separated by a constant pitch (outer box in the figure) 1604. A second plane has the inner boxes 1606 with different pitch in both X and Y directions. Because the inner box has the different pitch size, only some of them would form box-in-box structures. The offsets used would be the best observable pitch in box-in-box structures. This method works with dots in holes as well. In practice, to align two planes separated in Z, the $ACD_P$ could consist of a series of individual fresnel lenses on a pitch P. Such an array is easily fabricated on chrome on glass substrates or as 2-phase levels. The projected pattern of such an $ACD_P$ would consist of a series of dots or spots with transverse (X and Y) pitch P. The target ACD ($ACD_T$) could then consist of a series of square or circular openings on a pitch P'≠P. The combined IAO ($ACD_P$ and $ACD_T$ as described) will then act as the desired vernier pattern.

Figure 17:
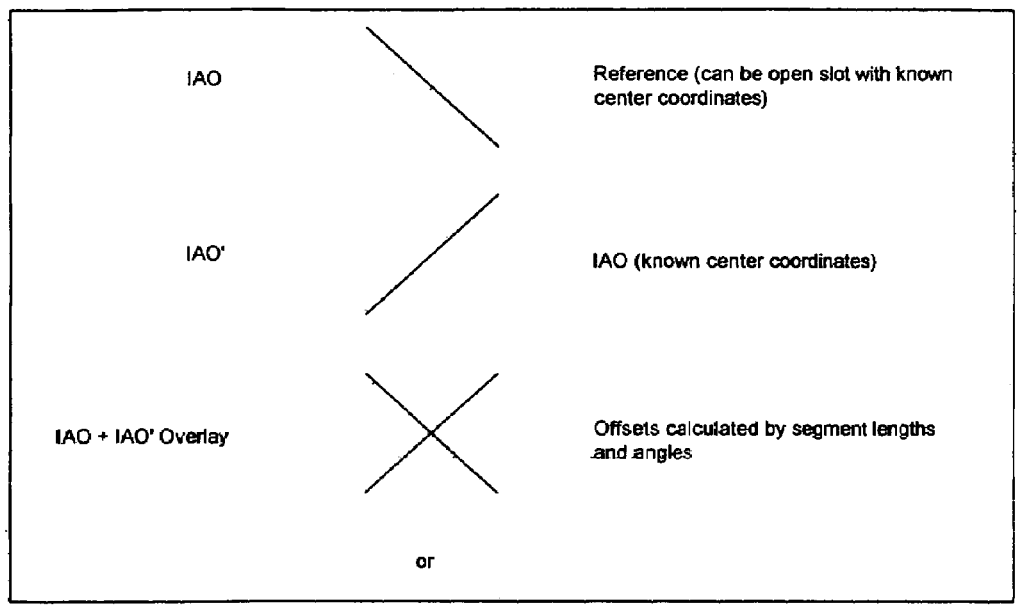
FIG. 17 is a schematic illustrating a technique using "X Marks" method.
Figure 18:
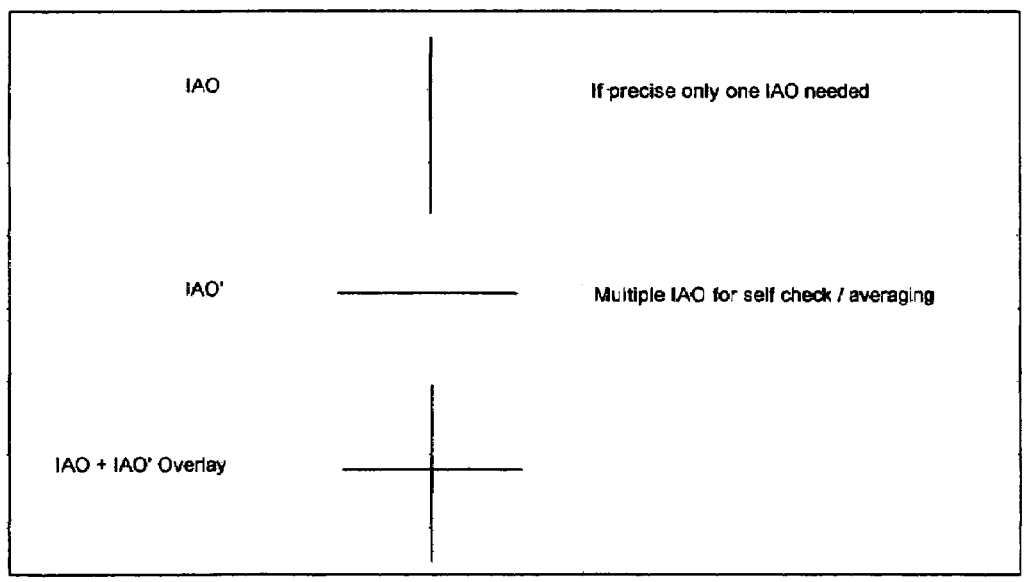
FIG. 18 is a schematic illustrating a technique using "Cross Marks" method.

FIG. 17 is a schematic illustrating a technique using "X Marks" method. FIG. 18 is a schematic illustrating a technique using "Cross Marks" method. As shown by these Figures, two straight lines can be used to determine the registration offsets. In FIG. 17, one line is tilted in one way and the other one is tilted in the other way. When these lines overlap, segments lengths and angles are used to calculate offsets. FIG. 18 illustrates a similar concept as FIG. 17, but the lines are vertical and horizontal. $ACD_P$ would consist of a cylindrical fresnel lens while $ACD_T$ is a cross (X) opening.

Figure 19:
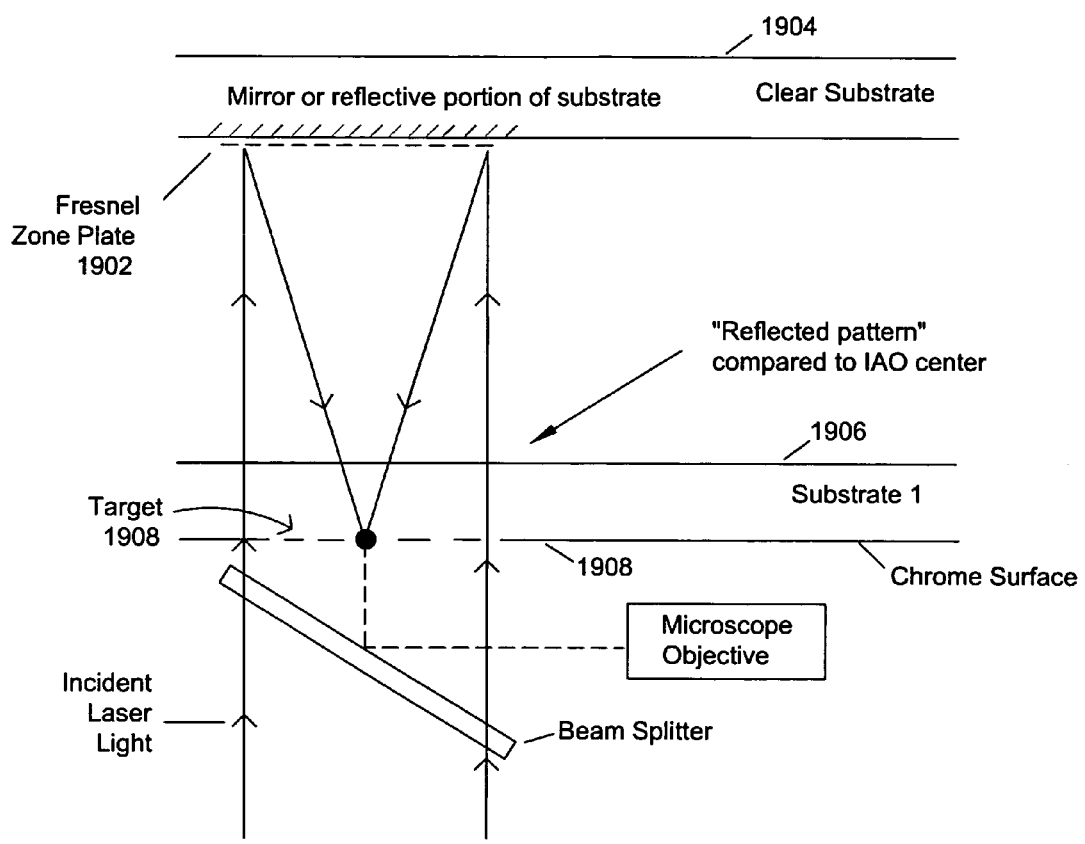
FIG. 19 is a block diagram illustrating a "Reflected Pattern" method.
Figure 20:
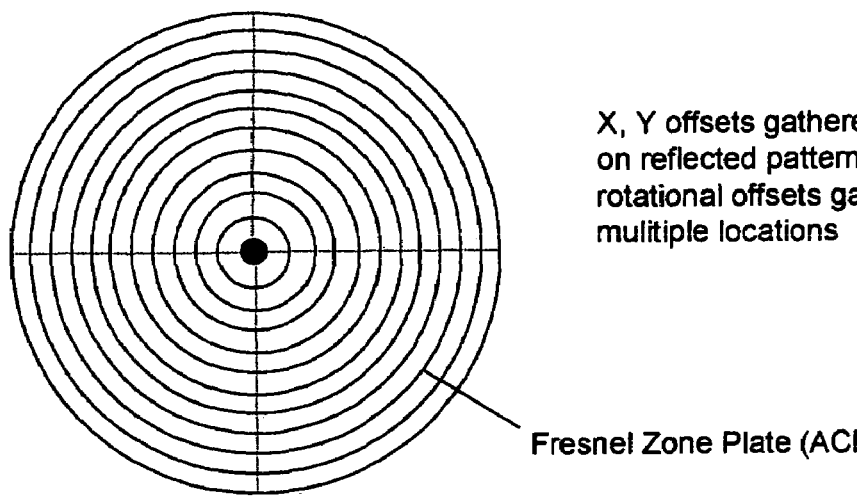
FIG. 20 illustrates the Fresnel Zone Plate of FIG. 19.

FIGS. 19 and 20 are block diagrams illustrating a "Reflected Pattern" method. In FIG. 19, a Fresnel Zone Plate (FZP) 1902 in a second substrate 1904 reflects laser back to a first substrate 1906 so that the reflected pattern can be compared to IAO center. The X and Y offsets can be gathered by focusing on the reflected pattern's plane. Rotational offsets are gathered by collecting the data at multiple locations. FZP 1902 may have a focal length set to the spacing between the first substrate 1904 and the second substrate 1906. A target 1908, that is, for example, an opening or hole in the first substrate is used to observe projected target spot. Microscope objective is focused on the target 1908. FIG. 20 illustrates the Fresnel Zone Plate of FIG. 19.

Figure 21:
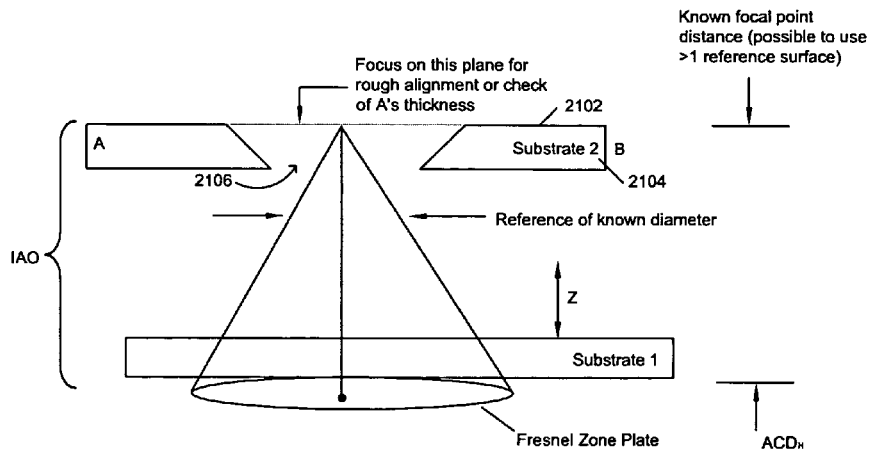
FIG. 21 is a block diagram illustrating a "Cone Cross-Section" method.
Figure 22:
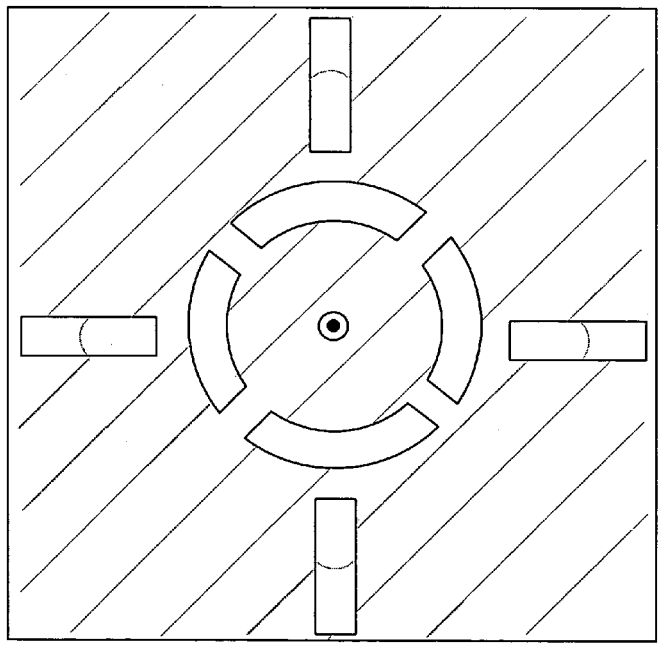
FIG. 22 is a block diagram illustrating a "Cone Cross-Section" method.

FIGS. 21 and 22 are block diagrams illustrating a "Cone Cross-Section" method. This method is similar to the method explained in the first embodiment, but an IAO hologram is focused to a point at the same plane as the top plane 2102 of the second substrate 2104 in this method. The second substrate 2104 has a hole 2106 with tilted sidewalls. By having the focal point and the top plane 2102 of the second substrate 2104 on the same plane, one could focus on the plane for rough alignment. Once in focus (see FIG. 22), alignment can be attained by best concentric fit. Translation of the alignment could be measured by comparing the locations of dot and hole. Similar to "Reflected Pattern" method, one could gather the rotational offset information by collecting data at multiple locations. Also in this method, one is able to determine the Z height by measuring cone diameter.

Reticle Plate Fabrication

The first embodiment makes no specific requirements on the size of the reticle or aperture plate (AP), the shape of the target patterns used for overlay or the type of materials used to fabricate the mask plate. There are many different patterns that can be used as overlay targets.

Applications

As described in U.S. Pat. No. 5,828,455, supra, an in-situ interferometer is constructed consisting of an aperture plate, AP, displaced approximately 5 mm in the Z direction from the reticle face. By utilizing the method of the present invention, binary axicons placed on the reticle surface and designed to have a focal length equal to the aperture plate Z distance when coupled with appropriate $ACD_T$, can serve as IAOs for aperture plate alignment. The transverse (x and y) offset of the aperture plate from the reticle in the final assembled unit can then be measured by the method of this invention and the result tabulated in a calibration file (FIG. 23) that lists aperture plate hole offsets from their ideal positions. An advantage of this calibration is that it allows for accurate evaluation of the entrance pupil location in the interpretation of the overlay data (box-in-box data) results as described in U.S. Pat. No. 5,828,455, supra.

Figure 23:
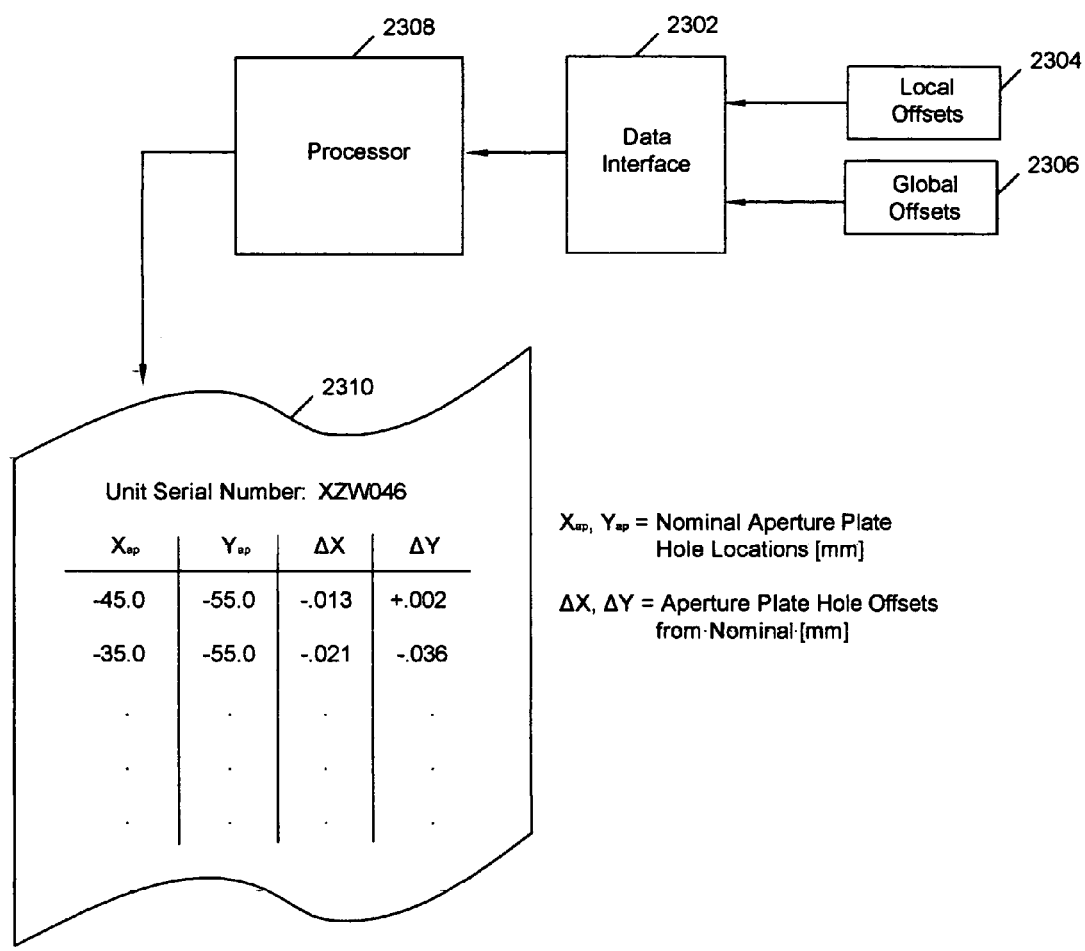
FIG. 23 is a block diagram illustrating an exemplary technique for creating an aperture plate calibration file in accordance with the invention.

FIG. 23 illustrates an example of an apparatus to generate a calibration file. As shown in FIG. 23, there is a data interface 2302 that receives local offsets 2304 and global offsets 2306. A processor 2308 then combines the local and global offsets and outputs a calibration file 2310 of corrected positional values of feature-to-feature alignment on surfaces.

Figure 24:
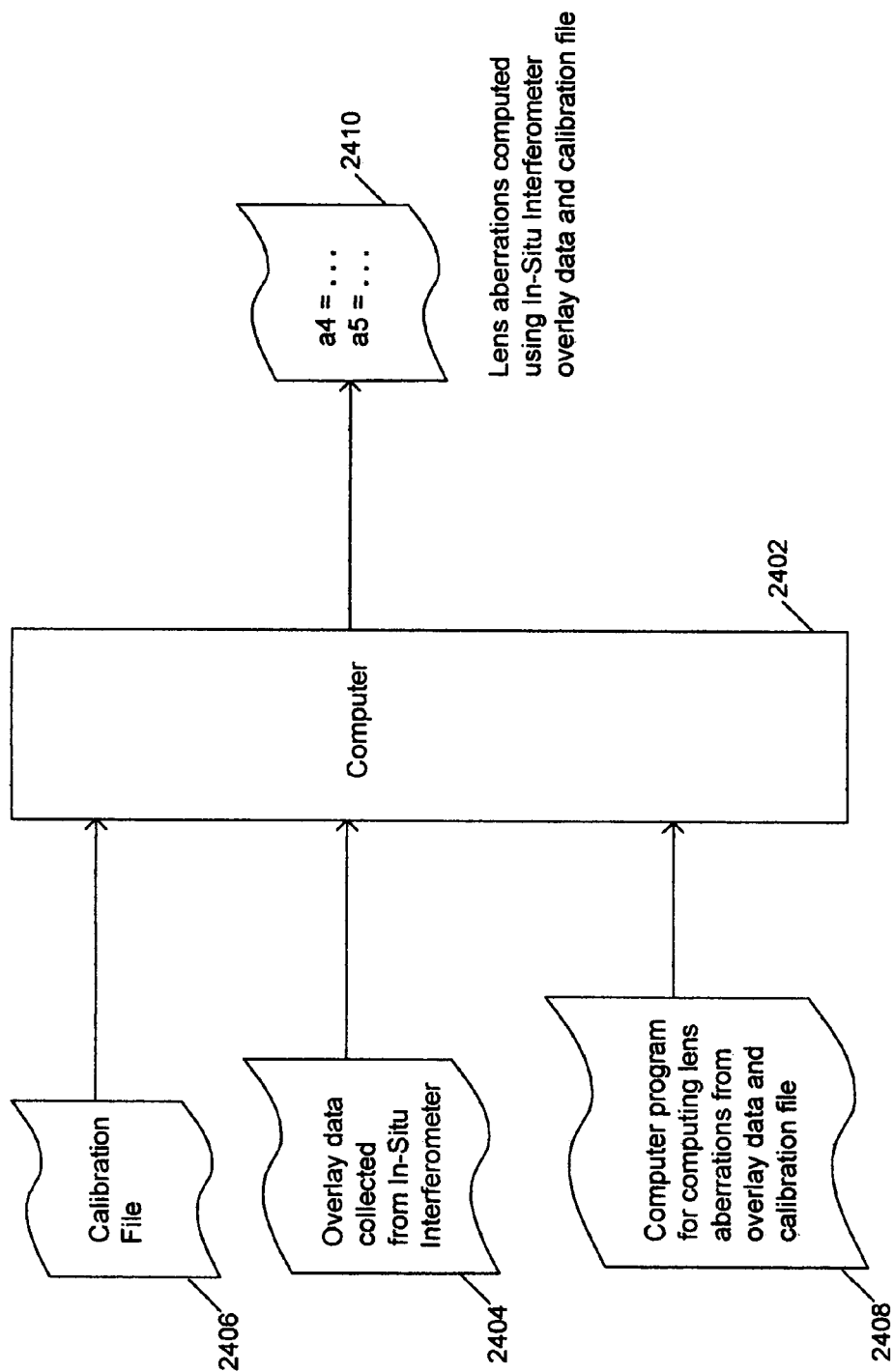
FIG. 24 is a block diagram illustrating an exemplary technique for utilizing the calibration file in computing lens aberrations.

FIG. 24 illustrates an example of the use of calibration data to compute improved lens aberration results. As illustrated in FIG. 24, a computer, or processor 2402 receives overlay data 2404 that has been collected, for example, from an in-situ interferometer. The computer 2402 also receives calibration data 2406, for example from a calibration tool. The computer then combines the overlay data and the calibration data in accordance with a set of instructions 2408 to determine lens aberration data 2410.

Figure 25:
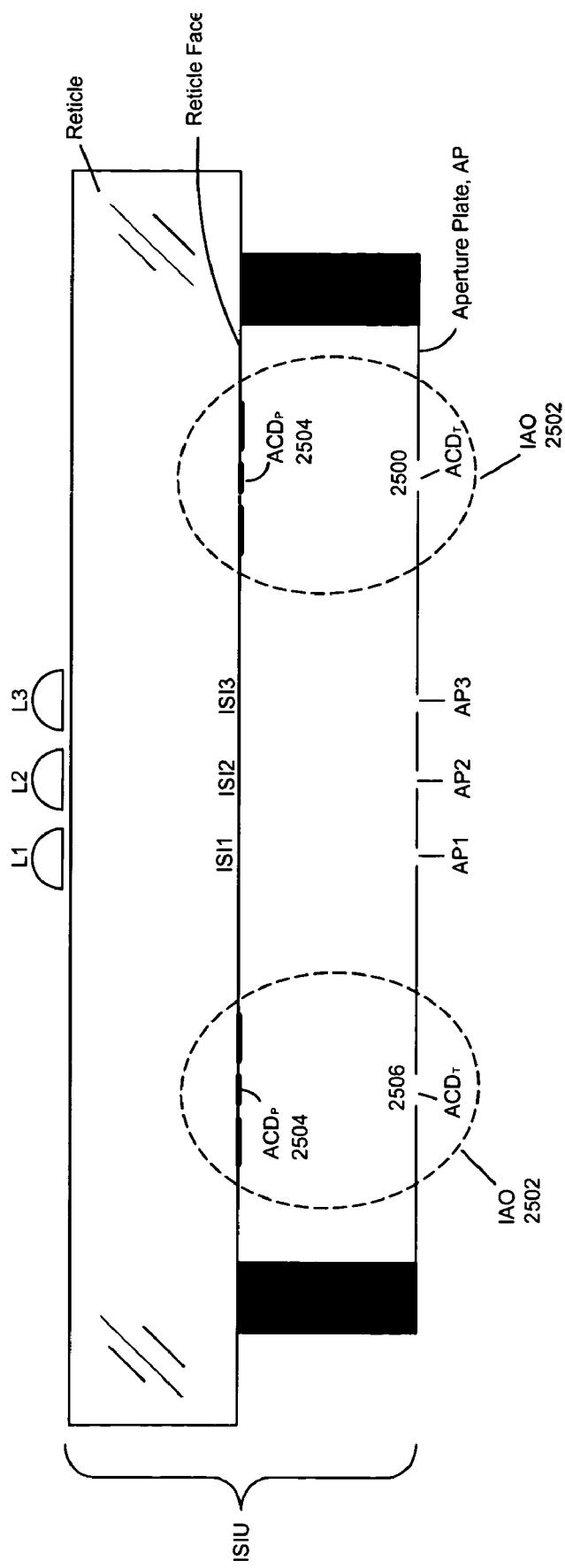
FIG. 25 is a block diagram illustrating an exemplary in-situ interferometer unit containing IAO structures.

FIG. 25 shows an in-situ interferometer unit, ISIU, as described in U.S. Pat. No. 5,828,455, supra containing additional IAO 2502 used to compute a calibration file. In one embodiment, $ACD_P$ 2004 is an axicon or fresnel zone plate that focuses on the aperture plate AP, while $ACD_T$ 2506 is a hole or opening as shown in FIG. 2. The lens L1, encoded face structure ISI1, and aperture plate hole AP1 together make up the optical elements of ISIU that generate overlay structures (inner box) at the wafer plane.

Figure 26:
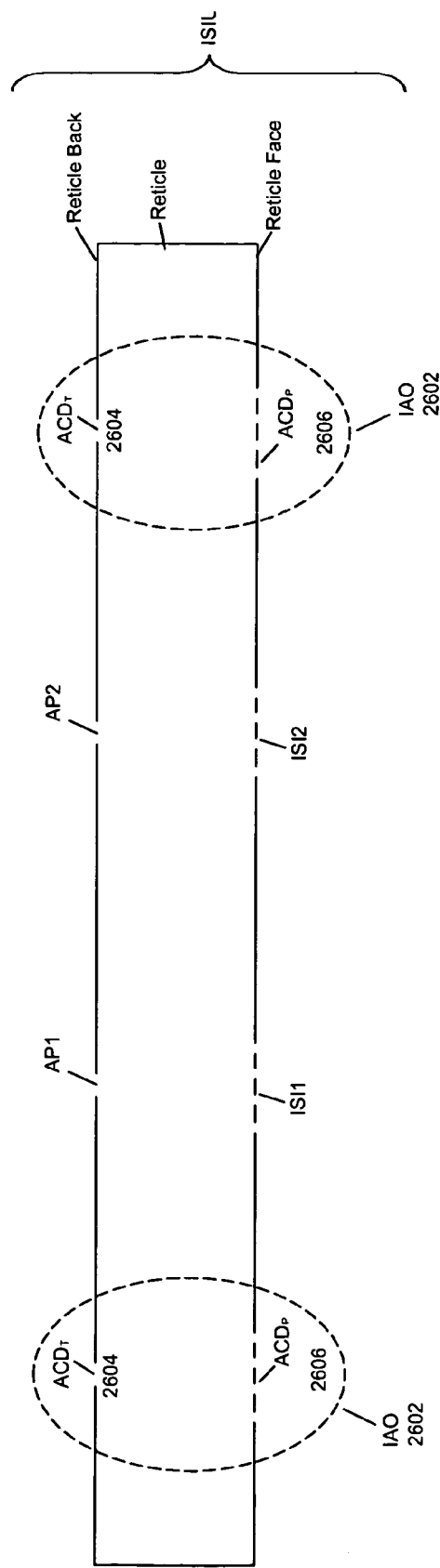
FIG. 26 is a block diagram illustrating another example of an in-situ interferometer unit containing IAO structures.

Other variants of the system described in U.S. Pat. No. 5,828,455, supra such as described in see, for example, "0.85NA ArF Exposure System and Performance", T. Kanda et al., *SPIE*, Vol. 5040, pp. 789-800, 2003, can utilize the present invention. FIG. 26 shows an in-situ interferometer unit (ISIU) containing IAO structures 2602 for determining reticle backside misalignment to the reticle face. In this case, since the reticle backside is also chrome coated, targets $ACD_T$ 2604 can be patterned and nominally align with fresnel lens or axicons, $ACD_P$, 2606 on the reticle face. Once this unit is built, a calibration file as in FIG. 23 can be generated by the method of this invention and used as in FIG. 24 to improve the performance in terms of producing more accurate lens aberration results.

The apparatus of U.S. Pat. No. 6,356,345, supra can also be improved by utilizing this invention in much the same way as U.S. Pat. No. 5,828,455, supra. The resulting radiant intensity profiles are also improved.

While the example described referred to particular types of substrates and surface, it is envisioned that a substrate or surface can include, for example, semiconductor surfaces, silicon wafers, notched wafers, flat panel displays, reticles, masks, metal plates, electronic recording media, electronic CCD, diode array or similar devices. Likewise, in the examples described different recording media can be used, for example, the recording media can be positive or negative resist material, electronic CCD or diode array or similar, or Liquid Crystal or other optically sensitive material.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

The invention claimed is:

1. An integral alignment optic comprising:
 a projection alignment component device on a first planar surface of an in-situ photolithography apparatus, the first surface also including a first set of features, the projection alignment component device comprising a centered axicon that projects a bright dot and a bright ring onto a second planar surface when illuminated by collimated light, wherein the second planar surface is offset in a direction perpendicular or normal to the first planar surface and is rigidly attached to the first planar surface, and the second planar surface not conjugate to the first planar surface with respect to any projection imaging system; and
 a target alignment component device attached to the second planar surface, the target alignment device being centered on a single projection alignment component device on the first planar surface, the target alignment component comprising a metal plate with an opening nominally centered on the bright dot and one or more openings centered along the perimeter of the bright ring.

2. The integral alignment optic of claim 1, wherein the in-situ photolithography apparatus is an in-situ interferometer or an in-situ- source metrology tool.

3. An integral alignment optic as defined in claim 1, wherein the projection alignment component on the projection component is a fresnel zone plate.

4. An integral alignment optic as defined in claim 1, wherein the projection component is a silicon wafer.

5. An integral alignment optic as defined in claim 1, wherein the projection component is a notched wafer.

6. An integral alignment optic as defined in claim 1, wherein the projection component is a flat panel display.

7. An integral alignment optic as defined in claim 1, wherein the projection component is a reticle.

8. An integral alignment optic as defined in claim 1, wherein the projection component is a mask.

9. An integral alignment optic as defined in claim 1, wherein the projection component is an electronic recording media.

10. An integral alignment optic as defined in claim 1, wherein the first surface is a reticle.

11. An integral alignment optic as defined in claim 1, wherein the first surface is a mask.

12. An integral alignment optic as defined in claim 1, wherein the second surface is a semiconductor.

13. An integral alignment optic as defined in claim 1, wherein the second surface is a silicon wafer.

14. An integral alignment optic as defined in claim 1, wherein the second surface is a notched wafer.

15. An integral alignment optic as defined in claim 1, wherein the second surface is a flat panel display.

16. An integral alignment optic as defined in claim 1, wherein the second surface is an electronic CCD.

17. An integral alignment optic as defined in claim 1, wherein the second surface is a diode array.

18. An integral alignment optic as defined in claim 1, wherein the second surface is a metal plate.

19. An integral alignment optic as defined in claim 1, wherein the second surface is an electronic recording media.

20. An integral alignment optic as defined in claim 1, wherein the second surface is an aperture plate.

21. An integral alignment optic as defined in claim 1, wherein aligning the first and second surface to each other is performed real-time.

22. An integral alignment optic as defined in claim 1, wherein aligning the first and second surface to each other comprises adjusting a separation between the first and second surface.

* * * * *